(12) United States Patent
Hayashi et al.

(10) Patent No.: US 8,564,033 B2
(45) Date of Patent: Oct. 22, 2013

(54) SOLID-STATE IMAGING DEVICE AND METHOD FOR MANUFACTURING THE SAME

(75) Inventors: Toshihiko Hayashi, Kanagawa (JP); Yoshiharu Kudoh, Kanagawa (JP)

(73) Assignee: Sony Corporation, Tokyo (JP)

(*) Notice: Subject to any disclaimer, the term of this patent is extended or adjusted under 35 U.S.C. 154(b) by 246 days.

(21) Appl. No.: 12/345,876

(22) Filed: Dec. 30, 2008

(65) Prior Publication Data

US 2009/0189236 A1  Jul. 30, 2009

(30) Foreign Application Priority Data

Jan. 24, 2008 (JP) ................................ 2008-013493
Jul. 24, 2008 (JP) ................................ 2008-190604

(51) Int. Cl.
*H01L 31/0216* (2006.01)

(52) U.S. Cl.
USPC ........................... 257/291; 257/292; 257/432

(58) Field of Classification Search
USPC ......................................... 257/291, 292, 432
See application file for complete search history.

(56) References Cited

U.S. PATENT DOCUMENTS

| 6,861,686 B2 * | 3/2005 | Lee et al. ....................... 257/291 |
| 2006/0163628 A1 * | 7/2006 | Mori et al. ..................... 257/291 |
| 2008/0036023 A1 * | 2/2008 | Park ............................... 257/432 |
| 2008/0042228 A1 * | 2/2008 | Han ............................... 257/432 |

FOREIGN PATENT DOCUMENTS

| JP | 2000-196055 A | 7/2000 |
| JP | 2000-223689 | 8/2000 |
| JP | 2004-363375 | 12/2004 |
| JP | 2005-026510 A | 1/2005 |
| JP | 2005-039053 A | 2/2005 |
| JP | 2006-093687 | 4/2006 |
| JP | 2006-294991 | * 10/2006 |
| JP | 2007-042933 A | 2/2007 |
| JP | 2007-207789 | 8/2007 |
| JP | 2007-281375 A | 10/2007 |
| JP | 2007-305675 A | 11/2007 |
| WO | WO 2007-129451 | 11/2007 |

OTHER PUBLICATIONS

Japanese Office Actions issued Jul. 31, 2012 for related Japanese Application Nos. 2010-044613, 2010-044614 and 2010-044615.

* cited by examiner

*Primary Examiner* — Tan N Tran
(74) *Attorney, Agent, or Firm* — Rader, Fishman & Grauer PLLC

(57) ABSTRACT

A solid-state imaging device includes: a light-receiving pixel part configured to be formed on a semiconductor substrate; a black-level reference pixel part configured to be formed on the semiconductor substrate; and a multilayer interconnect part configured to be provided over the semiconductor substrate. The multilayer interconnect part includes an insulating layer formed over the semiconductor substrate and metal interconnect layers formed as a plurality of layers in the insulating layer. The multilayer interconnect part has a first light-blocking film formed above an area between first metal interconnects of a first metal interconnect layer as one of the metal interconnect layers above the black-level reference pixel part, and a second light-blocking film that is connected to the first light-blocking film and is formed of a second metal interconnect layer over the first metal interconnect layer.

20 Claims, 19 Drawing Sheets

POSITION OF SECTIONAL VIEW

POSITION OF SECTIONAL VIEW

US 8,564,033 B2

SOLID-STATE IMAGING DEVICE AND METHOD FOR MANUFACTURING THE SAME

CROSS REFERENCES TO RELATED APPLICATIONS

The present invention contains subject matter related to Japanese Patent Application JP 2008-013493 filed in the Japan Patent Office on Jan. 24, 2008, and Japanese Patent Application JP 2008-190604 filed in the Japan Patent Office on Jul. 24, 2008, the entire contents of which being incorporated herein by reference.

BACKGROUND OF THE INVENTION

1. Field of the Invention

The present invention relates to a solid-state imaging device and a method for manufacturing the same.

2. Description of Related Art

In a CMOS solid-state imaging device, which is one of image sensors, generally light blocking is implemented by using a metal interconnect or an optical filter for the area that is desired to be free from light incidence thereon, such as a black-level reference pixel part and a peripheral circuit area.

In particular, if a film for implementing the light blocking is formed at the time of a step of forming a metal interconnect, the light-blocking film for the area that is desired to be free from light incidence thereon is formed at the same height as that of the interconnect layer because a CMOS logic process is applied as it is.

An example in which a light-blocking film for a black-level reference pixel part is formed in a step of forming a copper interconnect in a multilayer interconnect part will be described below with reference to FIG. 19, which is a schematic sectional view of a related-art CMOS image sensor.

As shown in FIG. 19, the related-art CMOS image sensor includes a light-receiving pixel part 112 and a black-level reference pixel part 113 that are formed on a semiconductor substrate 111 and formed of a photodiode. Furthermore, the related-art CMOS image sensor includes a multilayer interconnect part 114 formed on the light-receiving pixel part 112 and the black-level reference pixel part 113 (refer to e.g. Japanese Patent Laid-open No. 2006-294991).

The multilayer interconnect part 114 includes plural metal interconnects 130 (e.g. metal interconnects 131, 132, and 133) stacked sequentially from the semiconductor substrate 111 side along the thickness direction of the multilayer interconnect part 114, and an interlayer insulating film 140 that insulates the respective metal interconnects 130 from each other.

In the interlayer insulating film 140 (142) between the metal interconnect 130 (133) and the metal interconnect 130 (132) thereunder, a contact plug 151 that penetrates the interlayer insulating film 142 and connects the metal interconnect 133 to the metal interconnect 132 thereunder is formed.

On the top surface of an interlayer insulating film 145 formed to cover the top surface of the uppermost metal interconnect 130 (133), a pad 161 for electric connection to a peripheral circuit (not shown) or the like is formed by using e.g. aluminum (Al).

In the interlayer insulating film 145 between the pad 161 and the metal interconnect 133 (133c) directly beneath the pad 161, a contact plug 152 that penetrates the interlayer insulating film 145 and connects the pad 161 to the metal interconnect 133c is formed by using e.g. aluminum (Al).

The metal interconnect 133 (133a) opposed to the photodiode of the black-level reference pixel part 113 is formed as a light-blocking film that prevents light incidence on the photodiode region of the black-level reference pixel part 113.

For the CMOS image sensor, reduction in the thickness of the interconnect layer used as the light-blocking film is also simultaneously progressed because of miniaturization of the interconnect part due to reduction in the pixel size and because of the lowering of the interconnect height from the semiconductor substrate surface due to shortening of the optical path.

The reduction in the thickness of the interconnect layer will result in insufficient capability of the light-blocking film for preventing light incidence because the optical transmittance of a metal film exponentially decreases as the thickness thereof increases.

SUMMARY OF THE INVENTION

The problem to be solved is that it is impossible to sufficiently ensure the light blocking above a black-level reference pixel while achieving reduction in the thickness of the interconnect layer.

There is a need for the present invention to, for a solid-state imaging device having a light-blocking film, sufficiently ensure light blocking above a black-level reference pixel while achieving reduction in the thickness of an interconnect layer.

According to an embodiment of the present invention, there is provided a first solid-state imaging device including a light-receiving pixel part configured to be formed on a semiconductor substrate, a black-level reference pixel part configured to be formed on the semiconductor substrate, and a multilayer interconnect part configured to be provided over the semiconductor substrate including the light-receiving pixel part and the black-level reference pixel part. The multilayer interconnect part includes an insulating layer formed over the semiconductor substrate and metal interconnect layers formed as a plurality of layers in the insulating layer. The multilayer interconnect part has a first light-blocking film formed above an area between first metal interconnects of a first metal interconnect layer as one of the metal interconnect layers above the black-level reference pixel part, and a second light-blocking film that is connected to the first light-blocking film and is formed of a second metal interconnect layer over the first metal interconnect layer.

The first solid-state imaging device has the first light-blocking film formed above the area between the first metal interconnects of the first metal interconnect layer and the second light-blocking film that is connected to the first light-blocking film and is formed of the second metal interconnect layer over the first metal interconnect layer. Thus, the light-blocking films are formed in two layers. Therefore, a light-blocking structure having thickness larger than that of the related-art light-blocking film is formed. This sufficiently ensures the light blocking above the black-level reference pixel. In addition, because the light-blocking films are formed of a metal interconnect of the metal interconnect layer and a layer between the metal interconnect layers, an additional metal layer for the light-blocking film is not required.

According to an embodiment of the present invention, there is provided a second solid-state imaging device including a light-receiving pixel part configured to be formed on a semiconductor substrate, a black-level reference pixel part configured to be formed on the semiconductor substrate, and a multilayer interconnect part configured to be provided over the semiconductor substrate including the light-receiving pixel part and the black-level reference pixel part. The multilayer interconnect part includes an insulating layer formed over the semiconductor substrate and metal interconnect layers formed as a plurality of layers in the insulating layer. The multilayer interconnect part has a first light-blocking film formed above an area between first metal interconnects of a first metal interconnect layer as one of the metal interconnect layers above the black-level reference pixel part, and a second light-blocking film that is connected to the first light-blocking film and is formed of a second metal interconnect layer over the first metal interconnect layer. A plurality of light-blocking film groups each composed of the first light-blocking film and the second light-blocking film are formed.

In the second solid-state imaging device, because the plurality of light-blocking film groups each composed of the first light-blocking film and the second light-blocking film are formed, the light-blocking films are formed in four or more layers. Therefore, a light-blocking structure having thickness larger than that of the related-art light-blocking film is formed. This sufficiently ensures the light blocking above the black-level reference pixel. In addition, because the light-blocking films are formed of the metal interconnect layers and layers between the metal interconnect layers, an additional metal layer for the light-blocking film is not required.

According to an embodiment of the present invention, there is provided a third solid-state imaging device including a light-receiving pixel part configured to be formed on a semiconductor substrate, a black-level reference pixel part configured to be formed on the semiconductor substrate, and a multilayer interconnect part configured to be provided over the semiconductor substrate including the light-receiving pixel part and the black-level reference pixel part. The multilayer interconnect part includes an insulating layer formed over the semiconductor substrate and metal interconnect layers formed as a plurality of layers in the insulating layer. The multilayer interconnect part has a first light-blocking film formed of a first metal interconnect layer as one of the metal interconnect layers above the black-level reference pixel part, and a second light-blocking film formed of a second metal interconnect layer over the first metal interconnect layer above the black-level reference pixel part.

In the third solid-state imaging device, the first light-blocking film and the second light-blocking film are formed and thus a light-blocking structure having thickness larger than that of the light-blocking film of one layer in the related art is formed. This sufficiently enhances the light blocking above the black-level reference pixel. In addition, because the light-blocking films are formed of the metal interconnect layers, an additional metal layer for the light-blocking film is not required.

According to an embodiment of the present invention, there is provided a first method for manufacturing a solid-state imaging device including a light-receiving pixel part formed on a semiconductor substrate, a black-level reference pixel part formed on the semiconductor substrate, and a multilayer interconnect part provided over the semiconductor substrate including the light-receiving pixel part and the black-level reference pixel part. The multilayer interconnect part includes an insulating layer formed over the semiconductor substrate and metal interconnect layers formed as a plurality of layers in the insulating layer. The method includes the steps of forming a first light-blocking film above an area between first metal interconnects of a first metal interconnect layer of the metal interconnect layers above the black-level reference pixel part, and forming a second light-blocking film connected to the first light-blocking film by using a second metal interconnect layer over the first metal interconnect layer.

In the first manufacturing method for a solid-state imaging device, the first light-blocking film is formed above the area between the first metal interconnects of the first metal interconnect layer and the second light-blocking film is formed by using the second metal interconnect layer over the first metal interconnect layer. Thus, the light-blocking films are formed in two layers. Therefore, a light-blocking structure having thickness larger than that of the related-art light-blocking film is formed. This sufficiently ensures the light blocking above the black-level reference pixel. In addition, because the light-blocking films are formed by using the metal interconnect layer and a layer between the metal interconnect layers, an additional metal layer for the light-blocking film is not required.

According to an embodiment of the present invention, there is provided a second method for manufacturing a solid-state imaging device including a light-receiving pixel part formed on a semiconductor substrate, a black-level reference pixel part formed on the semiconductor substrate, and a multilayer interconnect part provided over the semiconductor substrate including the light-receiving pixel part and the black-level reference pixel part. The multilayer interconnect part includes an insulating layer formed over the semiconductor substrate and metal interconnect layers formed as a plurality of layers in the insulating layer. The method includes the steps of forming a first light-blocking film above an area between first metal interconnects of a first metal interconnect layer of the metal interconnect layers above the black-level reference pixel part, forming a second light-blocking film connected to the first light-blocking film by using a second metal interconnect layer over the first metal interconnect layer, forming a third light-blocking film connected to the second light-blocking film between the second metal interconnect layer and a third metal interconnect layer over the second metal interconnect layer, and forming a fourth light-blocking film connected to the third light-blocking film by using the third metal interconnect layer over the second metal interconnect layer.

In the second manufacturing method for a solid-state imaging device, the first light-blocking film, the second light-blocking film, the third light-blocking film, and the fourth light-blocking film are formed, and hence the light-blocking films are formed in four layers. Therefore, a light-blocking structure having thickness larger than that of the related-art light-blocking film is formed. This sufficiently ensures the light blocking above the black-level reference pixel. In addition, because the light-blocking films are formed by using the metal interconnect layers and layers of contact plugs formed between the metal interconnect layers, an additional metal layer for the light-blocking film is not required.

According to an embodiment of the present invention, there is provided a third method for manufacturing a solid-state imaging device including a light-receiving pixel part formed on a semiconductor substrate, a black-level reference pixel part formed on the semiconductor substrate, and a multilayer interconnect part provided over the semiconductor substrate including the light-receiving pixel part and the black-level reference pixel part. The multilayer interconnect part includes an insulating layer formed over the semiconductor substrate and metal interconnect layers formed as a plurality of layers in the insulating layer. The method includes the steps of forming a first light-blocking film by using a first metal interconnect layer of the metal interconnect layers above the black-level reference pixel part, and forming a second light-blocking film by using a second metal interconnect layer over the first metal interconnect layer above the black-level reference pixel part.

In the third manufacturing method for a solid-state imaging device, the second light-blocking film is formed above the first light-blocking film and thus a light-blocking structure having thickness larger than that of the light-blocking film of one layer in the related art is formed. This sufficiently enhances the light blocking above the black-level reference pixel. In addition, because the light-blocking films are formed by using the metal interconnect layers, an additional metal layer for the light-blocking film is not required.

In the first solid-state imaging device, the first light-blocking film is formed between the first metal interconnect layer and the second metal interconnect layer and the second light-blocking film is formed of the second metal interconnect layer, and thus the light-blocking films of two layers are formed. Thus, the capability of the light blocking above the black-level reference pixel can be enhanced. In addition, because the light-blocking films are formed of the metal interconnect layer and a layer between the metal interconnect layers, an additional metal layer for the light-blocking film does not need to be formed. Therefore, it is possible to decrease the thickness of the interconnect layer while keeping high light-blocking performance, and shorten the light-condensing distance.

In the second solid-state imaging device, the light-blocking films of four or more layers are formed. Thus, the capability of the light blocking above the black-level reference pixel can be enhanced. In addition, because the light-blocking films are formed of the metal interconnect layers and layers between the metal interconnect layers, an additional metal layer for the light-blocking film does not need to be formed. Therefore, it is possible to decrease the thickness of the interconnect layer while keeping high light-blocking performance, and shorten the light-condensing distance.

In the third solid-state imaging device, a light-blocking structure is formed of the first light-blocking film and the second light-blocking film. Thus, the capability of the light blocking above the black-level reference pixel can be enhanced. In addition, because the light-blocking films are formed of the metal interconnect layers, an additional metal layer for the light-blocking film does not need to be formed. Therefore, it is possible to decrease the thickness of the interconnect layer while keeping high light-blocking performance, and shorten the light-condensing distance.

In the first manufacturing method for a solid-state imaging device, the first light-blocking film is formed between the first metal interconnect layer and the second metal interconnect layer, and the second light-blocking film is formed by using the second metal interconnect layer. Therefore, the light-blocking films are formed in two layers, which can enhance the capability of the light blocking above the black-level reference pixel. In addition, because the light-blocking films are formed by using a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

In the second manufacturing method for a solid-state imaging device, the light-blocking films are formed in four layers. Thus, the capability of the light blocking above the black-level reference pixel can be enhanced. In addition, because the light-blocking films are formed by using layers between the metal interconnect layers and the metal interconnect layers, an additional metal layer for the light-blocking film does not need to be formed. Therefore, it is possible to decrease the thickness of the interconnect layer while keeping high light-blocking performance, and shorten the light-condensing distance.

In the third manufacturing method for a solid-state imaging device, the light-blocking films are formed in two layers. Thus, the capability of the light blocking above the black-level reference pixel can be enhanced. In addition, because the light-blocking films are formed by using the metal interconnect layers, an additional metal layer for the light-blocking film does not need to be formed. Therefore, it is possible to decrease the thickness of the interconnect layer while keeping high light-blocking performance, and shorten the light-condensing distance.

DETAILED DESCRIPTION OF THE PREFERRED EMBODIMENTS

Figure 1:
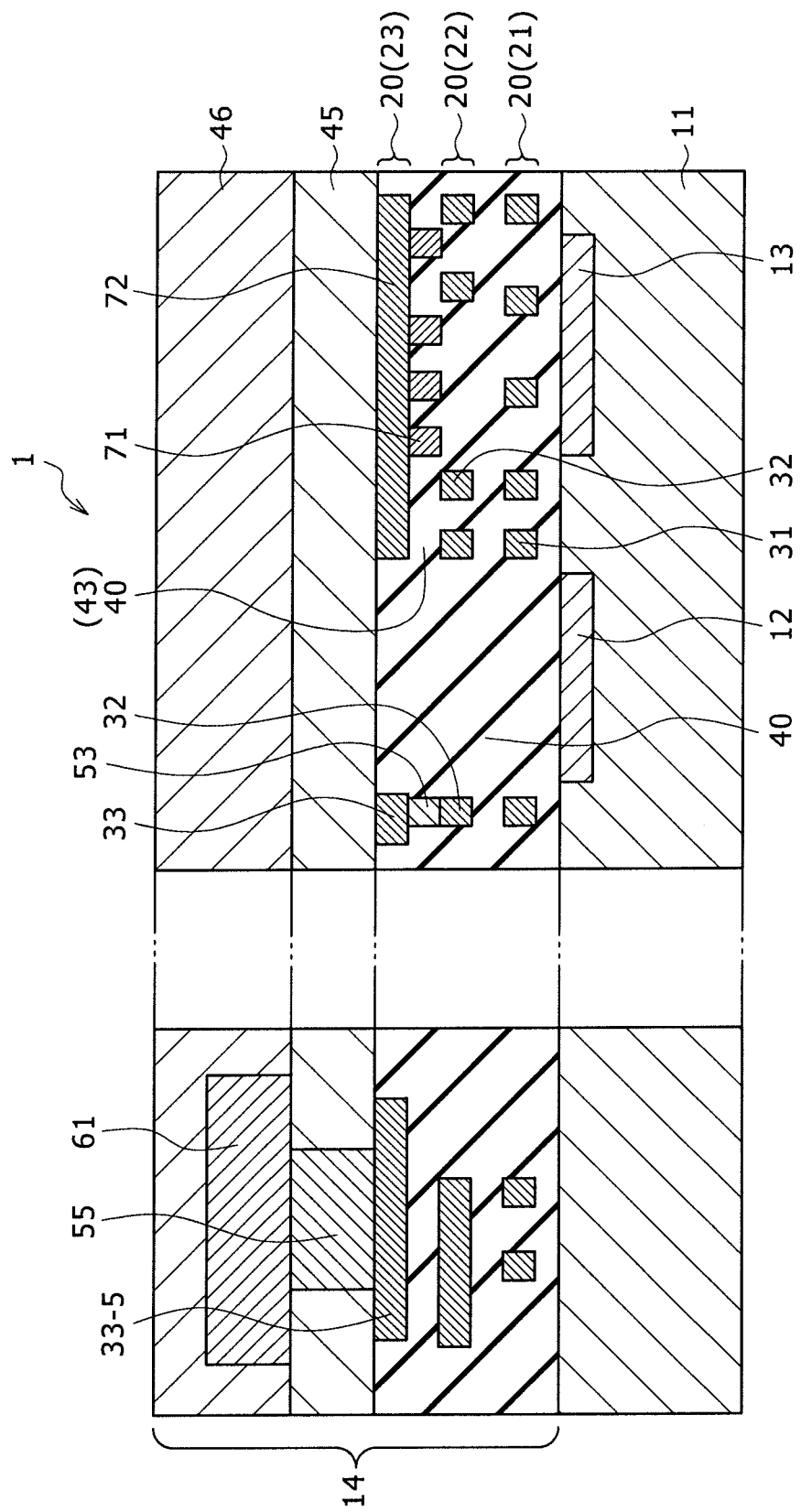
FIG. 1 is a sectional view showing the schematic configuration of a first embodiment of the present invention relating to the first solid-state imaging device.

A first embodiment of the present invention relating to the above-described first solid-state imaging device will be described below with reference to FIG. 1, which is a sectional view of the schematic structure of the first embodiment. FIG. 1 shows a CMOS image sensor as one example of the solid-state imaging device.

As shown in FIG. 1, a first solid-state imaging device 1 includes a light-receiving pixel part 12 and a black-level reference pixel part 13 that are formed on a semiconductor substrate 11 and formed of a photodiode. Furthermore, the first solid-state imaging device 1 includes a multilayer interconnect part 14 formed on the top surfaces of the light-receiving pixel part 12 and the black-level reference pixel part 13.

The multilayer interconnect part 14 includes plural metal interconnect layers 20 (e.g. a first metal interconnect layer 21, a second metal interconnect layer 22 (equivalent to the first metal interconnect layer), and a third metal interconnect layer 23 (equivalent to the second metal interconnect layer)) formed through sequential stacking from the semiconductor substrate 11 side with predetermined intervals along the thickness direction of the multilayer interconnect part 14. Furthermore, the multilayer interconnect part 14 includes an interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), a contact plug 53 that penetrates the interlayer insulating film 43 and connects a third metal interconnect 33 of the third metal interconnect layer 23 to a second metal interconnect 32 of the second metal interconnect layer 22 thereunder is formed. Naturally, as metal interconnects connected to each other by a contact plug, there are also metal interconnects formed of other metal interconnect layers, although not shown in the drawing.

On the top surface of an interlayer insulating film 45 formed to cover the top surface of the uppermost metal interconnect layer 20 (the third metal interconnect layer 23), a pad 61 for electric connection to a peripheral circuit (not shown) or the like is formed by using e.g. aluminum (Al).

In the interlayer insulating film 45 between the pad 61 and a third metal interconnect 33-5 of the third metal interconnect layer 23 directly beneath the pad 61, a contact plug 55 that penetrates the interlayer insulating film 45 and connects the pad 61 to the third metal interconnect 33-5 is formed by using e.g. aluminum (Al).

An interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13 in the interlayer insulating film 40 (43) between the second metal interconnect layer 22 and the third metal interconnect layer 23, a first light-blocking film 71 is formed separately from the second metal interconnect 32 (equivalent to the first metal interconnect) formed of the second metal interconnect layer 22. This first light-blocking film 71 is formed with e.g. line patterns.

A second light-blocking film 72 connected to the top surface of the first light-blocking film 71 is formed by using a third metal interconnect of the third metal interconnect layer 23. This second light-blocking film 72 is formed with e.g. a plane pattern.

By the light-blocking films of two layers, i.e. the first light-blocking film 71 and the second light-blocking film 72, light incidence on the photodiode region of the black-level reference pixel part 13 is blocked.

In the above description, the second light-blocking film 72 is formed of the uppermost third metal interconnect layer 23 and the first light-blocking film 71 is formed between the third metal interconnect layer 23 and the second metal interconnect layer 22 next thereto in the lower-layer direction. However, the first light-blocking film 71 may be formed between the first metal interconnect layer 21 and the second metal interconnect layer 22. In addition, if the number of metal interconnect layers is four or larger, the first light-blocking film 71 may be formed between metal interconnect layers as intermediate layers. Therefore, the second light-blocking film 72 is formed of the metal interconnect layer immediately above that of the first light-blocking film 71.

The first light-blocking film 71 may be formed with either line patterns or dot patterns. The line patterns may have either a uniform width or various widths. One example of the line patterns with various line widths will be described later as a second embodiment of the present invention.

Similarly, the dot patterns may have either a uniform size or various sizes.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the second light-blocking film 72. By forming the condensing lens also above the black-level reference pixel part 13, leakage of incident light into the black-level reference pixel part 13 is prevented.

In the first embodiment relating to the first solid-state imaging device, the imaging device has the first light-blocking film 71 formed above the areas among the second metal interconnects 32 of the second metal interconnect layer 22 and the second light-blocking film 72 that is connected to the first light-blocking film 71 and formed of the third metal interconnect layer 23 over the second metal interconnect layer 22. Therefore, the light-blocking films are formed in two layers. Thus, a light-blocking structure having thickness larger than that of the related-art light-blocking film is formed. This sufficiently ensures the light blocking above the black-level reference pixel part 13 and can enhance the light-blocking capability. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

The second embodiment of the present invention relating to the above-described first solid-state imaging device will be described below with reference to FIG. 2, which is a sectional view of the schematic structure of the second embodiment. This second embodiment is one example in which the arrangement and shape of the first light-blocking film 71 are different from those in the first embodiment because of difference in the arrangement of the second metal interconnect 32 of the second metal interconnect layer 22.

Figure 2:
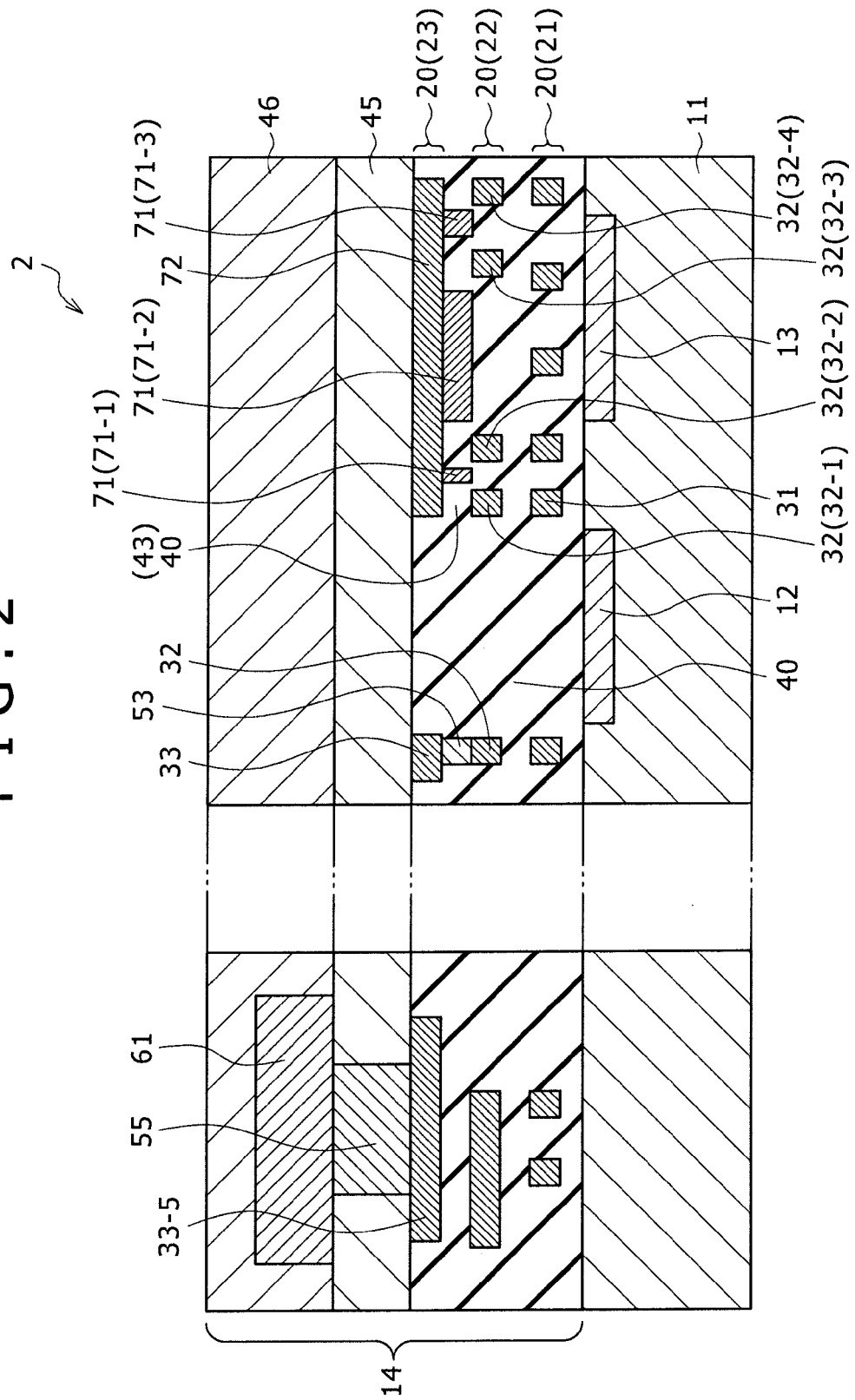
FIG. 2 is a sectional view showing the schematic configuration of a second embodiment of the present invention relating to the first solid-state imaging device.

As shown in FIG. 2, a first solid-state imaging device 2 includes the light-receiving pixel part 12 and the black-level reference pixel part 13 that are formed on the semiconductor substrate 11 and formed of a photodiode. Furthermore, the first solid-state imaging device 2 includes the multilayer interconnect part 14 formed on the top surfaces of the light-receiving pixel part 12 and the black-level reference pixel part 13.

The multilayer interconnect part 14 includes the plural metal interconnect layers 20 (e.g. the first metal interconnect layer 21, the second metal interconnect layer 22 (equivalent to the first metal interconnect layer), and the third metal interconnect layer 23 (equivalent to the second metal interconnect layer)) formed through sequential stacking from the semiconductor substrate 11 side with predetermined intervals along the thickness direction of the multilayer interconnect part 14. Furthermore, the multilayer interconnect part 14 includes the interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), the contact plug 53 that penetrates the interlayer insulating film 43 and connects the third metal interconnect 33 of the third metal interconnect layer 23 to the second metal interconnect 32 (equivalent to the first metal interconnect) of the second metal interconnect layer 22 thereunder is formed. Naturally, as metal interconnects connected to each other by a contact plug, there are also metal interconnects formed of other metal interconnect layers, although not shown in the drawing.

On the top surface of the interlayer insulating film 45 formed to cover the top surface of the uppermost metal interconnect layer 20 (the third metal interconnect layer 23), the pad 61 for electric connection to a peripheral circuit (not shown) or the like is formed by using e.g. aluminum (Al).

In the interlayer insulating film 45 between the pad 61 and the third metal interconnect 33-5 of the third metal interconnect layer 23 directly beneath the pad 61, the contact plug 55 that penetrates the interlayer insulating film 45 and connects the pad 61 to the third metal interconnect 33-5 is formed by using e.g. aluminum (Al).

The interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13 in the interlayer insulating film 40 (43) between the second metal interconnect layer 22 and the third metal interconnect layer 23, the first light-blocking film 71 is formed separately from the second metal interconnect 32 formed of the second metal interconnect layer 22.

The second light-blocking film 72 connected to the top surface of the first light-blocking film 71 is formed by using a third metal interconnect of the third metal interconnect layer 23. This second light-blocking film 72 is formed with e.g. a plane pattern.

The first light-blocking film 71 is formed with line patterns. Over the area between second metal interconnects 32-1 and 32-2 and the area between second metal interconnects 32-3 and 32-4 as narrow areas between the second metal interconnects of the second metal interconnect layer 22 under the first light-blocking film 71, a first light-blocking film 71-1 with a narrow line pattern is formed separately from the second metal interconnects 32-1 and 32-2 and a first light-blocking film 71-3 with a narrow line pattern is formed separately from the second metal interconnects 32-3 and 32-4 similarly. On the other hand, over the area between the second metal interconnects 32-2 and 32-3 as a wide area between the second metal interconnects of the second metal interconnect layer 22 under the first light-blocking film 71, a first light-blocking film 71-2 with a wide line pattern can be formed separately from the second metal interconnects 32-2 and 32-3.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the second light-blocking film 72. By forming the condensing lens also above the black-level reference pixel part 13, leakage of incident light into the black-level reference pixel part 13 is prevented.

In the second embodiment relating to the first solid-state imaging device, the imaging device has the first light-blocking film 71 formed above the areas among the second metal interconnects 32 of the second metal interconnect layer 22 and the second light-blocking film 72 that is connected to the first light-blocking film 71 and formed of the third metal interconnect layer 23 over the second metal interconnect layer 22. Therefore, the light-blocking films are formed in two layers. Thus, a light-blocking structure having thickness larger than that of the related-art light-blocking film is formed. This sufficiently ensures the light blocking above the black-level reference pixel part 13 and can enhance the light-blocking capability. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

A third embodiment of the present invention relating to the above-described first solid-state imaging device will be described below with reference to FIG. 3, which is a sectional view of the schematic structure of the third embodiment. This third embodiment is one example in which the arrangement and shape of the first light-blocking film 71 are different from those in the first embodiment because of difference in the arrangement of the second metal interconnect 32 of the second metal interconnect layer 22.

Figure 3:
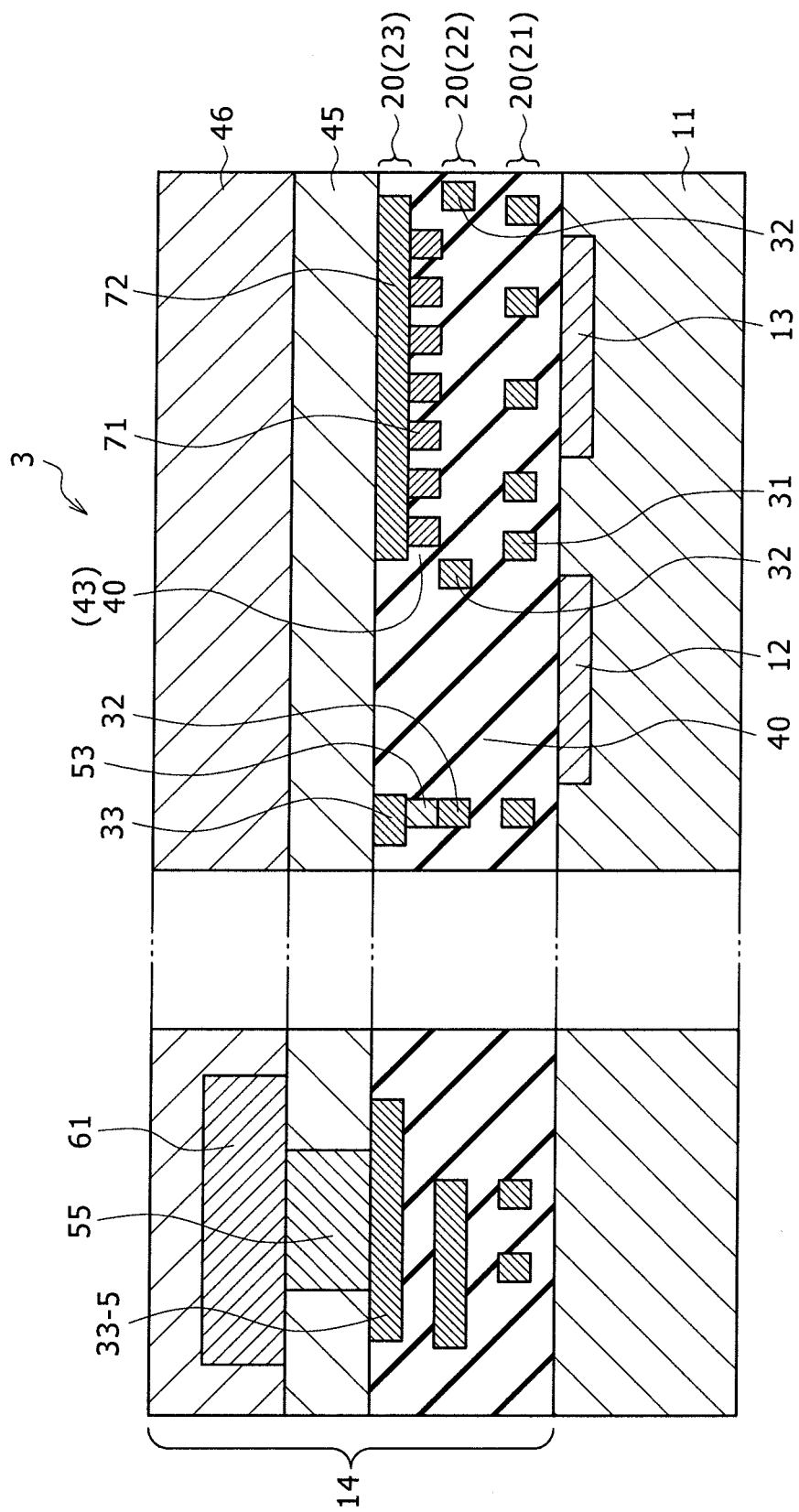
FIG. 3 is a sectional view showing the schematic configuration of a third embodiment of the present invention relating to the first solid-state imaging device.

As shown in FIG. 3, a first solid-state imaging device 3 includes the light-receiving pixel part 12 and the black-level reference pixel part 13 that are formed on the semiconductor substrate 11 and formed of a photodiode. Furthermore, the first solid-state imaging device 3 includes the multilayer interconnect part 14 formed on the top surfaces of the light-receiving pixel part 12 and the black-level reference pixel part 13.

The multilayer interconnect part 14 includes the plural metal interconnect layers 20 (e.g. the first metal interconnect layer 21, the second metal interconnect layer 22 (equivalent to the first metal interconnect layer), and the third metal interconnect layer 23 (equivalent to the second metal interconnect layer)) formed through sequential stacking from the semiconductor substrate side with predetermined intervals along the thickness direction of the multilayer interconnect part 14. Furthermore, the multilayer interconnect part 14 includes the interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), the contact plug 53 that penetrates the interlayer insulating film 43 and connects the third metal interconnect 33 of the third metal interconnect layer 23 to the second metal interconnect 32 (equivalent to the first metal interconnect) of the second metal interconnect layer 22 thereunder is formed. Naturally, as metal interconnects connected to each other by a contact plug, there are also metal interconnects formed of other metal interconnect layers, although not shown in the drawing.

On the top surface of the interlayer insulating film 45 formed to cover the top surface of the uppermost metal interconnect layer 20 (the third metal interconnect layer 23), the pad 61 for electric connection to a peripheral circuit (not shown) or the like is formed by using e.g. aluminum (Al).

In the interlayer insulating film 45 between the pad 61 and the third metal interconnect 33-5 of the third metal interconnect layer 23 directly beneath the pad 61, the contact plug 55 that penetrates the interlayer insulating film 45 and connects the pad 61 to the third metal interconnect 33-5 is formed by using e.g. aluminum (Al).

The interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13 in the interlayer insulating film 40 (43) between the second metal interconnect layer 22 and the third metal interconnect layer 23, the first light-blocking film 71 is formed separately from the second metal interconnect 32 formed of the second metal interconnect layer 22. This first light-blocking film 71 is formed with e.g. line patterns.

The second light-blocking film 72 connected to the top surface of the first light-blocking film 71 is formed by using a third metal interconnect of the third metal interconnect layer 23. This second light-blocking film 72 is formed with e.g. a plane pattern.

In this embodiment, the second metal interconnect 32 of the second metal interconnect layer 22 is not formed at the position opposed to the photodiode of the black-level reference pixel part 13. Therefore, the first light-blocking film 71 with e.g. line patterns on plural rows is formed in the whole of the area opposed to the photodiode of the black-level reference pixel part 13.

It is also possible to form the first light-blocking film 71 with e.g. plural dot patterns arranged in a matrix as described above.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the second light-blocking film 72. By forming the condensing lens also above the black-level reference pixel part 13, leakage of incident light into the black-level reference pixel part 13 is prevented.

In the third embodiment relating to the first solid-state imaging device, the imaging device has the first light-blocking film 71 formed above the areas among the second metal interconnects 32 of the second metal interconnect layer 22 and the second light-blocking film 72 that is connected to the first light-blocking film 71 and formed of the third metal interconnect layer 23 over the second metal interconnect layer 22. Therefore, the light-blocking films are formed in two layers. Thus, a light-blocking structure having thickness larger than that of the related-art light-blocking film is formed. This sufficiently ensures the light blocking above the black-level reference pixel part 13 and can enhance the light-blocking capability. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

Moreover, the first light-blocking film 71 can be formed with e.g. line patterns having equal intervals, and thus the first light-blocking film 71 is formed with high density. Therefore, the light-blocking performance can be further enhanced compared with the first embodiment.

A fourth embodiment of the present invention relating to the above-described first solid-state imaging device will be described below with reference to FIG. 4, which is a sectional view of the schematic structure of the fourth embodiment. This fourth embodiment is one example obtained by forming a third light-blocking film 73 on the second light-blocking film 72 for the same structure of light-blocking films as that of the first light-blocking film 71 and the second light-blocking film 72 in the first embodiment.

Figure 4:
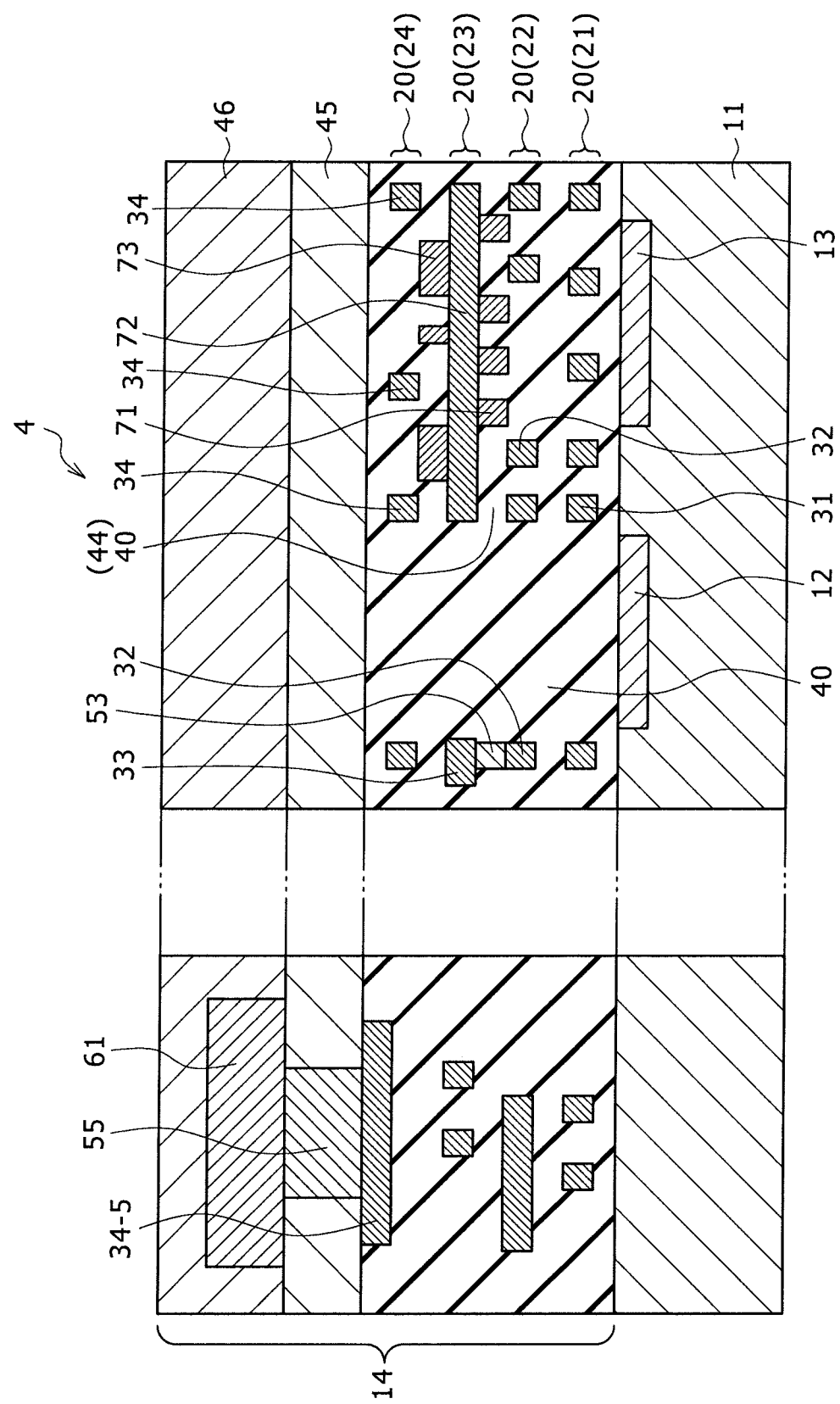
FIG. 4 is a sectional view showing the schematic configuration of a fourth embodiment of the present invention relating to the first solid-state imaging device.

As shown in FIG. 4, a first solid-state imaging device 4 includes the light-receiving pixel part 12 and the black-level reference pixel part 13 that are formed on the semiconductor substrate 11 and formed of a photodiode. Furthermore, the first solid-state imaging device 4 includes the multilayer interconnect part 14 formed on the top surfaces of the light-receiving pixel part 12 and the black-level reference pixel part 13.

The multilayer interconnect part 14 includes the plural metal interconnect layers 20 (e.g. the first metal interconnect layer 21, the second metal interconnect layer 22 (equivalent to the first metal interconnect layer), the third metal interconnect layer 23 (equivalent to the second metal interconnect layer), and a fourth metal interconnect layer 24) formed through sequential stacking from the semiconductor substrate side with predetermined intervals along the thickness direction of the multilayer interconnect part 14. Furthermore, the multilayer interconnect part 14 includes the interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), the contact plug 53 that penetrates the interlayer insulating film 43 and connects the third metal interconnect 33 of the third metal interconnect layer 23 to the second metal interconnect 32 (equivalent to the first metal interconnect) of the second metal interconnect layer 22 thereunder is formed. Naturally, as metal interconnects connected to each other by a contact plug, there are also metal interconnects formed of other metal interconnect layers, although not shown in the drawing.

On the top surface of the interlayer insulating film 45 formed to cover the top surface of the uppermost metal interconnect layer 20 (the fourth metal interconnect layer 24), the pad 61 for electric connection to a peripheral circuit (not shown) or the like is formed by using e.g. aluminum (Al).

In the interlayer insulating film 45 between the pad 61 and a fourth metal interconnect 34-5 of the fourth metal interconnect layer 24 directly beneath the pad 61, the contact plug 55 that penetrates the interlayer insulating film 45 and connects the pad 61 to the fourth metal interconnect 34-5 is formed by using e.g. aluminum (Al).

The interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13 in the interlayer insulating film 40 (43) between the second metal interconnect layer 22 and the third metal interconnect layer 23, the first light-blocking film 71 is formed separately from the second metal interconnect 32 formed of the second metal interconnect layer 22. This first light-blocking film 71 is formed with e.g. line patterns.

The second light-blocking film 72 connected to the top surface of the first light-blocking film 71 is formed by using a third metal interconnect of the third metal interconnect layer 23. This second light-blocking film 72 is formed with e.g. a plane pattern.

By the light-blocking films of two layers, i.e. the first light-blocking film 71 and the second light-blocking film 72, light incidence on the photodiode region of the black-level reference pixel part 13 is blocked.

Furthermore, in the interlayer insulating film 40 (44) between the third metal interconnect layer 23 and the fourth metal interconnect layer 24, the third light-blocking film 73 is formed separately from a fourth metal interconnect 34 formed of the fourth metal interconnect layer 24. This third light-blocking film 73 is formed with e.g. line patterns.

It is preferable that this third light-blocking film 73 be formed with e.g. line patterns and be so formed as to be at least opposed to the areas in which the first light-blocking film 71 is not formed through the second light-blocking film 72 in such a manner as to be separated from (be not electrically connected to) the fourth metal interconnect 34 of the fourth metal interconnect layer 24 upper the third light-blocking film 73.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surfaces of the second light-blocking film 72 and the third light-blocking film 73. By forming the condensing lens also above the black-level reference pixel part 13, leakage of incident light into the black-level reference pixel part 13 is prevented.

In the fourth embodiment relating to the first solid-state imaging device, the imaging device has the third light-blocking film 73 on the second light-blocking film 72 in addition to the structure of the first embodiment, and therefore the light-blocking films are formed in three layers. Thus, a light-blocking structure having thickness larger than that of the related-art light-blocking film is formed. This sufficiently ensures the light blocking above the black-level reference pixel part 13 and can enhance the light-blocking capability. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

A fifth embodiment of the present invention as a modification example of the fourth embodiment will be described below with reference to FIG. 5, which is a sectional view of the schematic structure of the fifth embodiment.

Figure 5:
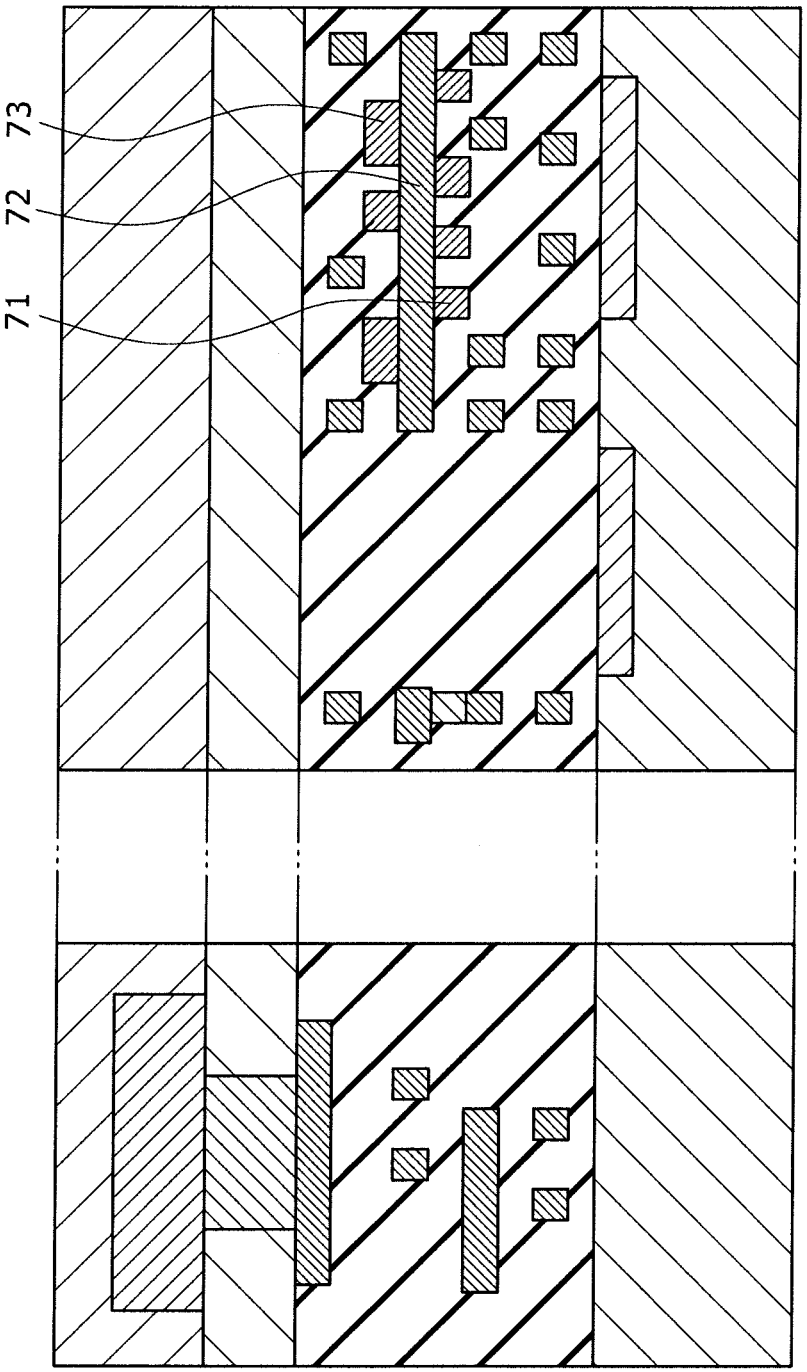
FIG. 5 is a sectional view showing the schematic configuration of a fifth embodiment of the present invention relating to the first solid-state imaging device.

As shown in FIG. 5, in the modification example, the first light-blocking film 71 is formed with line patterns and the third light-blocking film 73 is also formed with line patterns in such a way that a part of the first light-blocking film 71 and a part of the third light-blocking film 73 overlap with each other through the second light-blocking film 72 in plan view.

The other structure of the fifth embodiment is the same as that of the fourth embodiment.

No problem occurs even when the third light-blocking film 73 overlaps with the area in which the first light-blocking film 71 is formed in plan view in this manner.

In the fifth embodiment relating to the first solid-state imaging device, the imaging device has the third light-blocking film 73 on the second light-blocking film 72 in addition to the structure of the first embodiment, and therefore the light-blocking films are formed in three layers. Thus, a light-blocking structure having thickness larger than that of the related-art light-blocking film is formed. This sufficiently ensures the light blocking above the black-level reference pixel part 13 and can enhance the light-blocking capability. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

Furthermore, because the third light-blocking film 73 is so formed above the areas in which the first light-blocking film 71 is not formed as to be not connected to the fourth metal interconnect 34, the light-blocking performance can be further enhanced compared with the fourth embodiment.

Figure 6:
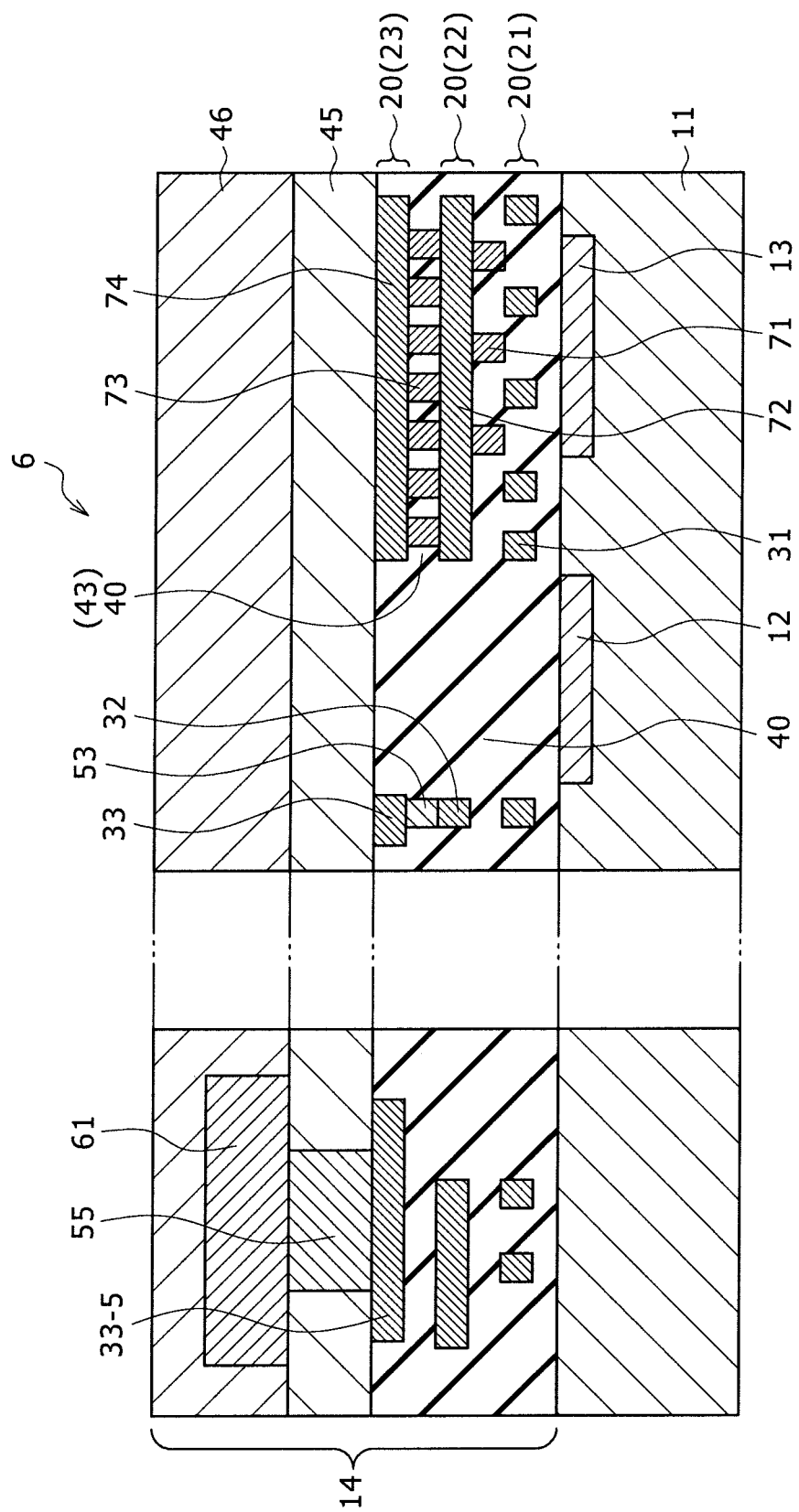
FIG. 6 is a sectional view showing the schematic configuration of a sixth embodiment of the present invention relating to the second solid-state imaging device.

A sixth embodiment of the present invention relating to the above-described second solid-state imaging device will be described below with reference to FIG. 6, which is a sectional view of the schematic structure of the sixth embodiment. FIG. 6 shows a CMOS image sensor as one example of the solid-state imaging device.

As shown in FIG. 6, a second solid-state imaging device 6 includes a light-receiving pixel part 12 and a black-level reference pixel part 13 that are formed on a semiconductor substrate 11 and formed of a photodiode. Furthermore, the second solid-state imaging device 6 includes a multilayer interconnect part 14 formed on the top surfaces of the light-receiving pixel part 12 and the black-level reference pixel part 13.

The multilayer interconnect part 14 includes plural metal interconnect layers 20 (e.g. a first metal interconnect layer 21, a second metal interconnect layer 22, and a third metal interconnect layer 23) formed through sequential stacking from the semiconductor substrate 11 side with predetermined intervals along the thickness direction of the multilayer interconnect part 14. Furthermore, the multilayer interconnect part 14 includes an interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), a contact plug 53 that penetrates the interlayer insulating film 43 and connects a third metal interconnect 33 of the third metal interconnect layer 23 to a second metal interconnect 32 of the second metal interconnect layer 22 thereunder is formed. Naturally, as metal interconnects connected to each other by a contact plug, there are also metal interconnects formed of other metal interconnect layers, although not shown in the drawing.

On the top surface of an interlayer insulating film 45 formed to cover the top surface of the uppermost metal interconnect layer 20 (the third metal interconnect layer 23), a pad 61 for electric connection to a peripheral circuit (not shown) or the like is formed by using e.g. aluminum (Al).

In the interlayer insulating film 45 between the pad 61 and a third metal interconnect 33-5 of the third metal interconnect layer 23 directly beneath the pad 61, a contact plug 55 that penetrates the interlayer insulating film 45 and connects the pad 61 to the third metal interconnect 33-5 is formed by using e.g. aluminum (Al).

An interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13 in the interlayer insulating film 40 (42) between the first metal interconnect layer 21 and the second metal interconnect layer 22, a first light-blocking film 71 is formed separately from a first metal interconnect 31 formed of the first metal interconnect layer 21. This first light-blocking film 71 is formed with e.g. line patterns.

A second light-blocking film 72 connected to the top surface of the first light-blocking film 71 is formed by using a second metal interconnect of the second metal interconnect layer 22. This second light-blocking film 72 is formed with e.g. a plane pattern.

Furthermore, in the interlayer insulating film 40 (43) between the second metal interconnect layer 22 and the third metal interconnect layer 23, a third light-blocking film 73 connected to the second light-blocking film 72 is formed. This third light-blocking film 73 is formed with e.g. line patterns.

A fourth light-blocking film 74 connected to the top surface of the third light-blocking film 73 is formed by using a third metal interconnect of the third metal interconnect layer 23. This fourth light-blocking film 74 is formed with e.g. a plane pattern.

By the light-blocking films of four layers, i.e. the first light-blocking film 71, the second light-blocking film 72, the third light-blocking film 73, and the fourth light-blocking film 74, light incidence on the photodiode region of the black-level reference pixel part 13 is blocked.

In this configuration, basically the first light-blocking film 71 formed between the metal interconnect layers and the second light-blocking film 72 formed of the metal interconnect layer on the first light-blocking film 71 are regarded as one pair, and plural pairs (two pairs, in the sixth embodiment) are successively formed. The imaging device of the sixth embodiment is different from the above-described first solid-state imaging device in that the arrangement of the third light-blocking film 73 as an intermediate layer is not limited by the positions of the metal interconnects of the metal interconnect layers on and under the third light-blocking film 73.

Thus, the light-blocking performance can be further enhanced by forming the third light-blocking film 73 with high density.

The first light-blocking film 71 and the third light-blocking film 73 may be formed with either line patterns or dot patterns. The line patterns may have either a uniform width or various widths.

Similarly, the dot patterns may have either a uniform size or various sizes.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the fourth light-blocking film 74. By forming the condensing lens also above the black-level reference pixel part 13, leakage of incident light into the black-level reference pixel part 13 is prevented.

In the sixth embodiment relating to the second solid-state imaging device, the imaging device has plural pairs of light-blocking films equivalent to the first light-blocking film 71 and the second light-blocking film 72 in the first solid-state imaging device. Therefore, compared with the first solid-state imaging device, the light blocking above the black-level reference pixel part 13 can be sufficiently ensured and the light-blocking capability can be enhanced. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

Furthermore, the second light-blocking film 72 and the fourth light-blocking film 74 formed of plane metal films are formed through the interlayer insulating film 40 (43). In general, because the insulating film and the metal film, which are different in the stress, are stacked, separation at the interface between the insulating film and the metal film possibly occurs due to the stress difference between the insulating film and the metal film.

However, in the above-described configuration, the third light-blocking film 73 formed with line patterns or dot patterns is provided between the second light-blocking film 72 and the fourth light-blocking film 74, and thus the stress is dispersed due to the third light-blocking film 73. As a result, the adhesion between the second light-blocking film 72 and the interlayer insulating film 40 (43) and the adhesion between the fourth light-blocking film 74 and the interlayer insulating film 40 (43) are enhanced by the third light-blocking film 73.

Therefore, the second light-blocking film 72 and the fourth light-blocking film 74 are hardly separated from the interlayer insulating film 40 (43).

Figure 7:
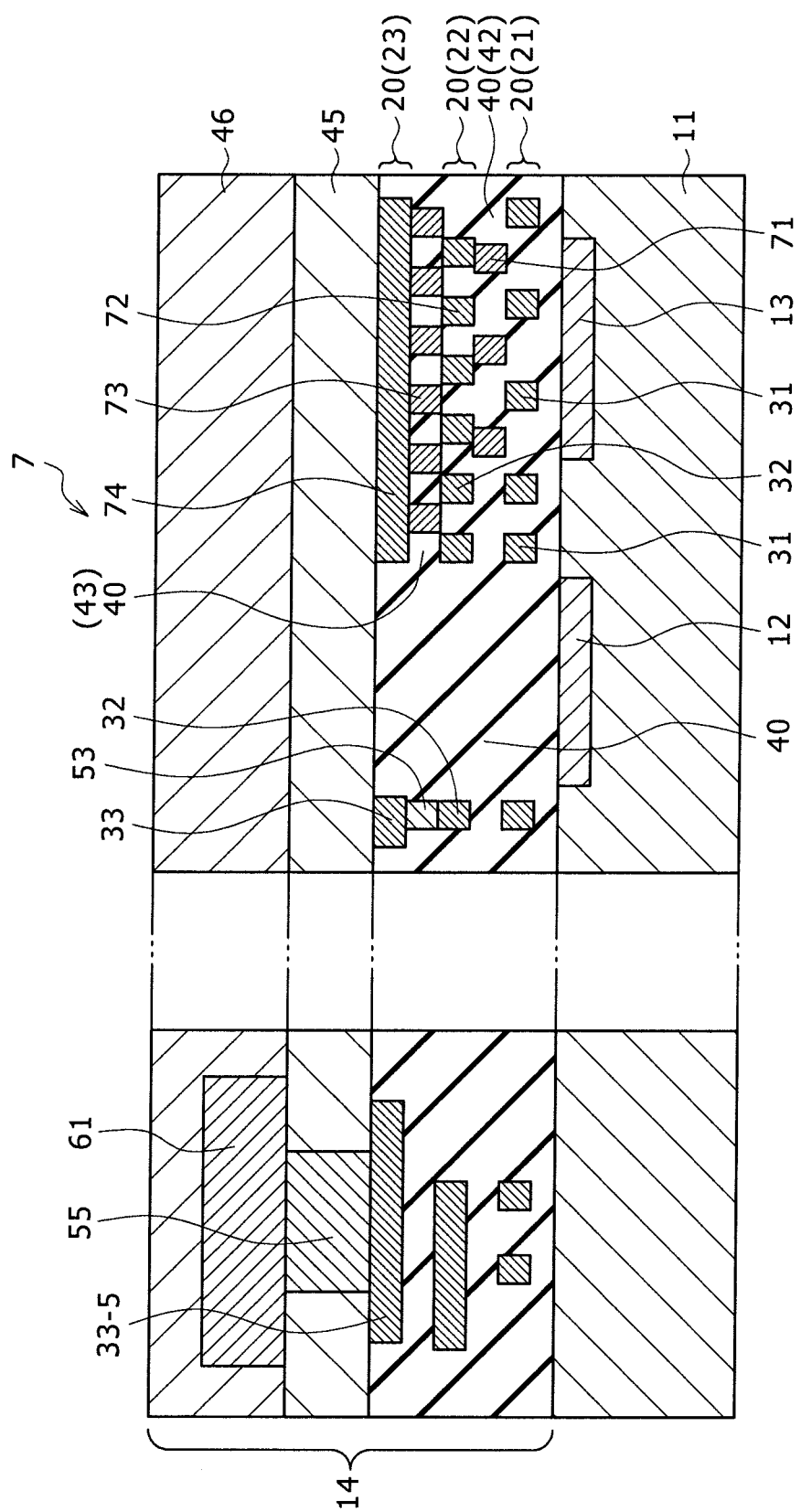
FIG. 7 is a sectional view showing the schematic configuration of a seventh embodiment of the present invention relating to the second solid-state imaging device.

A seventh embodiment of the present invention relating to the above-described second solid-state imaging device will be described below with reference to FIG. 7, which is a sectional view of the schematic structure of the seventh embodiment. FIG. 7 shows one example obtained by changing the pattern shape of the second light-blocking film in the sixth embodiment relating to the second solid-state imaging device.

As shown in FIG. 7, a second solid-state imaging device 7 includes the light-receiving pixel part 12 and the black-level reference pixel part 13 that are formed on the semiconductor substrate 11 and formed of a photodiode. Furthermore, the second solid-state imaging device 7 includes the multilayer interconnect part 14 formed on the top surfaces of the light-receiving pixel part 12 and the black-level reference pixel part 13.

The multilayer interconnect part 14 includes the plural metal interconnect layers 20 (e.g. the first metal interconnect layer 21, the second metal interconnect layer 22, and the third metal interconnect layer 23) formed through sequential stacking from the semiconductor substrate 11 side with predetermined intervals along the thickness direction of the multilayer interconnect part 14. Furthermore, the multilayer interconnect part 14 includes the interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), the contact plug 53 that penetrates the interlayer insulating film 43 and connects the third metal interconnect 33 of the third metal interconnect layer 23 to the second metal interconnect 32 of the second metal interconnect layer 22 thereunder is formed. Naturally, as metal interconnects connected to each other by a contact plug, there are also metal interconnects formed of other metal interconnect layers, although not shown in the drawing.

On the top surface of the interlayer insulating film 45 formed to cover the top surface of the uppermost metal interconnect layer 20 (the third metal interconnect layer 23), the pad 61 for electric connection to a peripheral circuit (not shown) or the like is formed by using e.g. aluminum (Al).

In the interlayer insulating film 45 between the pad 61 and the third metal interconnect 33-5 of the third metal interconnect layer 23 directly beneath the pad 61, the contact plug 55 that penetrates the interlayer insulating film 45 and connects the pad 61 to the third metal interconnect 33-5 is formed by using e.g. aluminum (Al).

The interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13 in the interlayer insulating film 40 (42) between the first metal interconnect layer 21 and the second metal interconnect layer 22, the first light-blocking film 71 is formed separately from the first metal interconnect 31 formed of the first metal interconnect layer 21. This first light-blocking film 71 is formed with e.g. line patterns.

The second light-blocking film 72 connected to the top surface of the first light-blocking film 71 is formed by using a second metal interconnect of the second metal interconnect layer 22. This second light-blocking film 72 is formed with line patterns or dot patterns.

Furthermore, in the interlayer insulating film 40 (43) between the second metal interconnect layer 22 and the third metal interconnect layer. 23, the third light-blocking film 73 connected to the second light-blocking film 72 is formed. This third light-blocking film 73 is formed with e.g. line patterns.

It is preferable that the first light-blocking film 71 and the second light-blocking film 72 be connected to each other and the second light-blocking film 72 and the third light-blocking film 73 be connected to each other. However, these light-blocking films may not necessarily be connected if the connecting is impossible because of the limit of the pattern arrangement.

The fourth light-blocking film 74 connected to the top surface of the third light-blocking film 73 is formed by using a third metal interconnect of the third metal interconnect layer 23. This fourth light-blocking film 74 is formed with e.g. a plane pattern.

By the light-blocking films of four layers, i.e. the first light-blocking film 71, the second light-blocking film 72, the third light-blocking film 73, and the fourth light-blocking film 74, light incidence on the photodiode region of the black-level reference pixel part 13 is blocked.

If the second light-blocking film 72 is formed with line patterns, for example, it is preferable that the third light-blocking film 73 be also formed with line patterns and be provided above the areas in which the second light-blocking film 72 is not formed.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the fourth light-blocking film 74. By forming the condensing lens also above the black-level reference pixel part 13, leakage of incident light into the black-level reference pixel part 13 is prevented.

In the seventh embodiment relating to the second solid-state imaging device, the imaging device has plural pairs of light-blocking films equivalent to the first light-blocking film 71 and the second light-blocking film 72 in the first solid-state imaging device. Therefore, compared with the first solid-state imaging device, the light blocking above the black-level reference pixel part 13 can be sufficiently ensured and the light-blocking capability can be enhanced. In addition, because the light-blocking films are formed of a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

Moreover, because the second light-blocking film 72 is formed with e.g. line patterns, thickness reduction of the second light-blocking film 72 is suppressed even when chemical mechanical polishing (CMP) is performed in the forming of the second light-blocking film 72. This allows ensuring of the desired thickness of the second light-blocking film 72. If the second light-blocking film 72 is formed with a plane pattern, it will be often affected by thickness reduction at the time of CMP.

Figure 8:
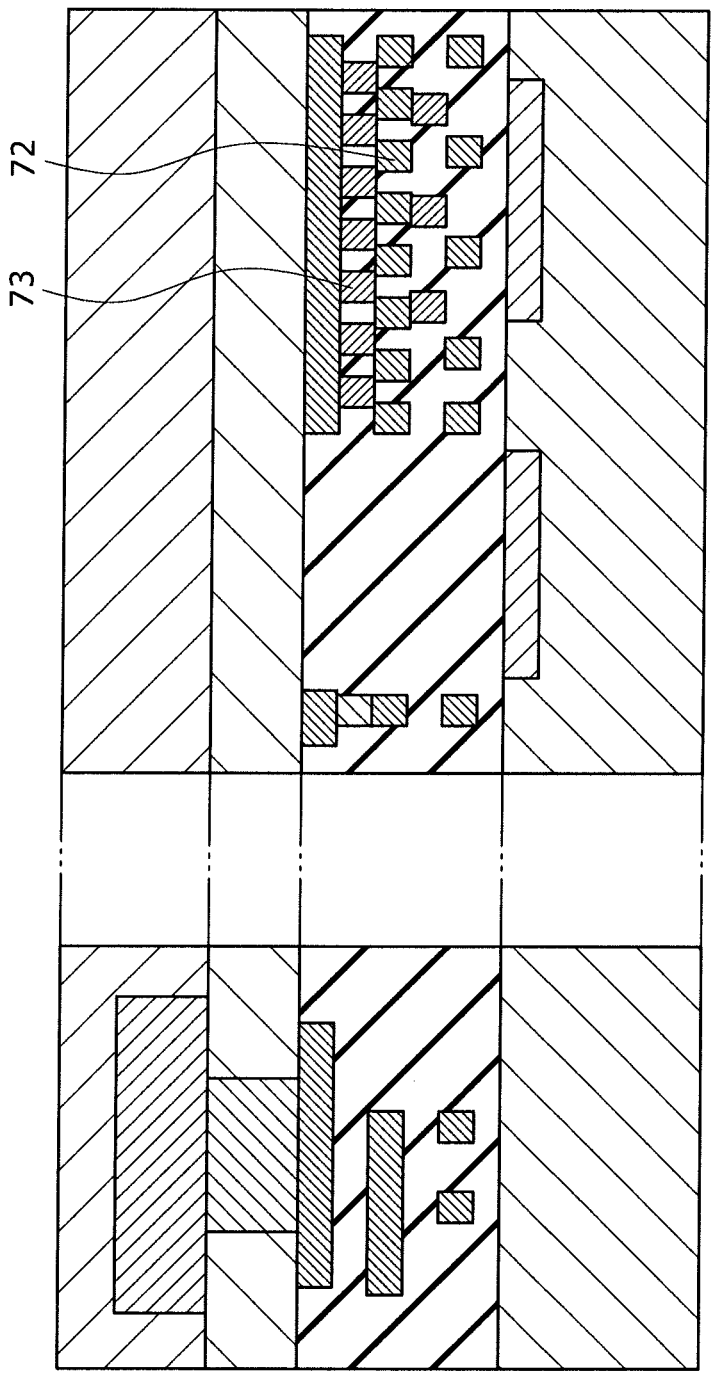
FIG. 8 is a sectional view showing the schematic configuration of another configuration example of the seventh embodiment.

Furthermore, as shown in FIG. 8, if the second light-blocking film 72 is formed with e.g. line patterns, the third light-blocking film 73 may be formed in such a way that a part of the third light-blocking film 73 overlaps with a part of the second light-blocking film 72. By forming the light-blocking films overlapping with each other in this manner, light leakage between the light-blocking films can be prevented and thus the light-blocking performance can be further enhanced.

Figure 9:
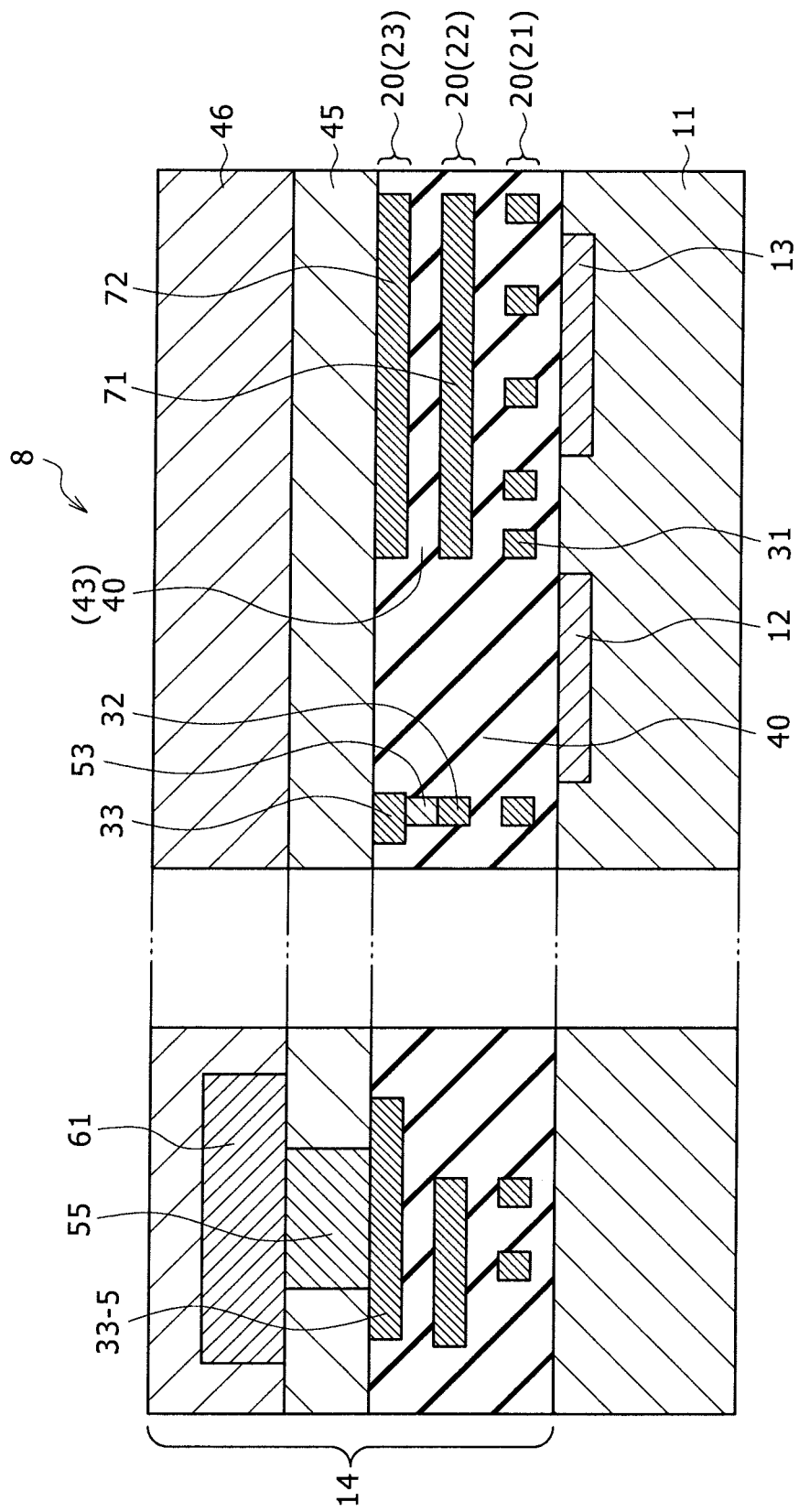
FIG. 9 is a sectional view showing the schematic configuration of an eighth embodiment of the present invention relating to the third solid-state imaging device.

An eighth embodiment of the present invention relating to the above-described third solid-state imaging device will be described below with reference to FIG. 9, which is a sectional view of the schematic structure of the eighth embodiment. FIG. 9 shows a CMOS image sensor as one example of the solid-state imaging device.

As shown in FIG. 9, a third solid-state imaging device 8 includes a light-receiving pixel part 12 and a black-level reference pixel part 13 that are formed on a semiconductor substrate 11 and formed of a photodiode. Furthermore, the third solid-state imaging device 8 includes a multilayer interconnect part 14 formed on the top surfaces of the light-receiving pixel part 12 and the black-level reference pixel part 13.

The multilayer interconnect part 14 includes plural metal interconnect layers 20 (e.g. a first metal interconnect layer 21, a second metal interconnect layer 22 (equivalent to the first metal interconnect layer), and a third metal interconnect layer 23 (equivalent to the second metal interconnect layer)) formed through sequential stacking from the semiconductor substrate 11 side with predetermined intervals along the thickness direction of the multilayer interconnect part 14. Furthermore, the multilayer interconnect part 14 includes an interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), a contact plug 53 that penetrates the interlayer insulating film 43 and connects a third metal interconnect 33 of the third metal interconnect layer 23 to a second metal interconnect 32 of the second metal interconnect layer 22 thereunder is formed. Naturally, as metal interconnects connected to each other by a contact plug, there are also metal interconnects formed of other metal interconnect layers, although not shown in the drawing.

On the top surface of an interlayer insulating film 45 formed to cover the top surface of the uppermost metal interconnect layer 20 (the third metal interconnect layer 23), a pad 61 for electric connection to a peripheral circuit (not shown) or the like is formed by using e.g. aluminum (Al).

In the interlayer insulating film 45 between the pad 61 and a third metal interconnect 33-5 of the third metal interconnect layer 23 directly beneath the pad 61, a contact plug 55 that penetrates the interlayer insulating film 45 and connects the pad 61 to the third metal interconnect 33-5 is formed by using e.g. aluminum (Al).

An interlayer insulating film 46 covering the pad 61 is formed on the interlayer insulating film 45, and an aperture for exposing the surface of the pad 61 is formed above the pad 61 although not shown in the drawing.

At the position opposed to the photodiode of the black-level reference pixel part 13, a first light-blocking film 71 is formed by using a second metal interconnect of the second metal interconnect layer 22. This first light-blocking film 71 is formed with e.g. a plane pattern.

Above the first light-blocking film 71, a second light-blocking film 72 is formed by using a third metal interconnect of the third metal interconnect layer 23. This second light-blocking film 72 is formed with e.g. a plane pattern.

By the light-blocking films of two layers, i.e. the first light-blocking film 71 and the second light-blocking film 72, light incidence on the photodiode region of the black-level reference pixel part 13 is blocked.

Although not shown in the drawing, a further light-blocking film may be formed above the second light-blocking film 72 by using a metal interconnect layer over the second metal interconnect layer.

In this configuration, the light-blocking films are formed by using metal interconnects of metal interconnect layers. Therefore, this configuration has an advantage that the forming of the light-blocking films is not limited by the positions of metal interconnects of the metal interconnect layers over and under the light-blocking films.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the second light-blocking film 72. By forming the condensing lens also above the black-level reference pixel part 13, leakage of incident light into the black-level reference pixel part 13 is prevented.

In the eighth embodiment relating to the third solid-state imaging device, light-blocking films of two layers, i.e. the first light-blocking film 71 and the second light-blocking film 72, are formed and thus a light-blocking structure having thickness larger than that of the light-blocking film of one layer in the related art is formed. This can enhance the light-blocking performance and sufficiently enhances the light blocking above the black-level reference pixel part 13. In addition, because the first light-blocking film 71 and the second light-blocking film 72 are formed of metal interconnects of the second metal interconnect layer 22 and the third metal interconnect layer 23, respectively, an additional metal layer for the light-blocking film does not need to be formed. Therefore, it is possible to decrease the thickness of the interconnect layer while keeping high light-blocking performance, and shorten the light-condensing distance.

Figure 10:
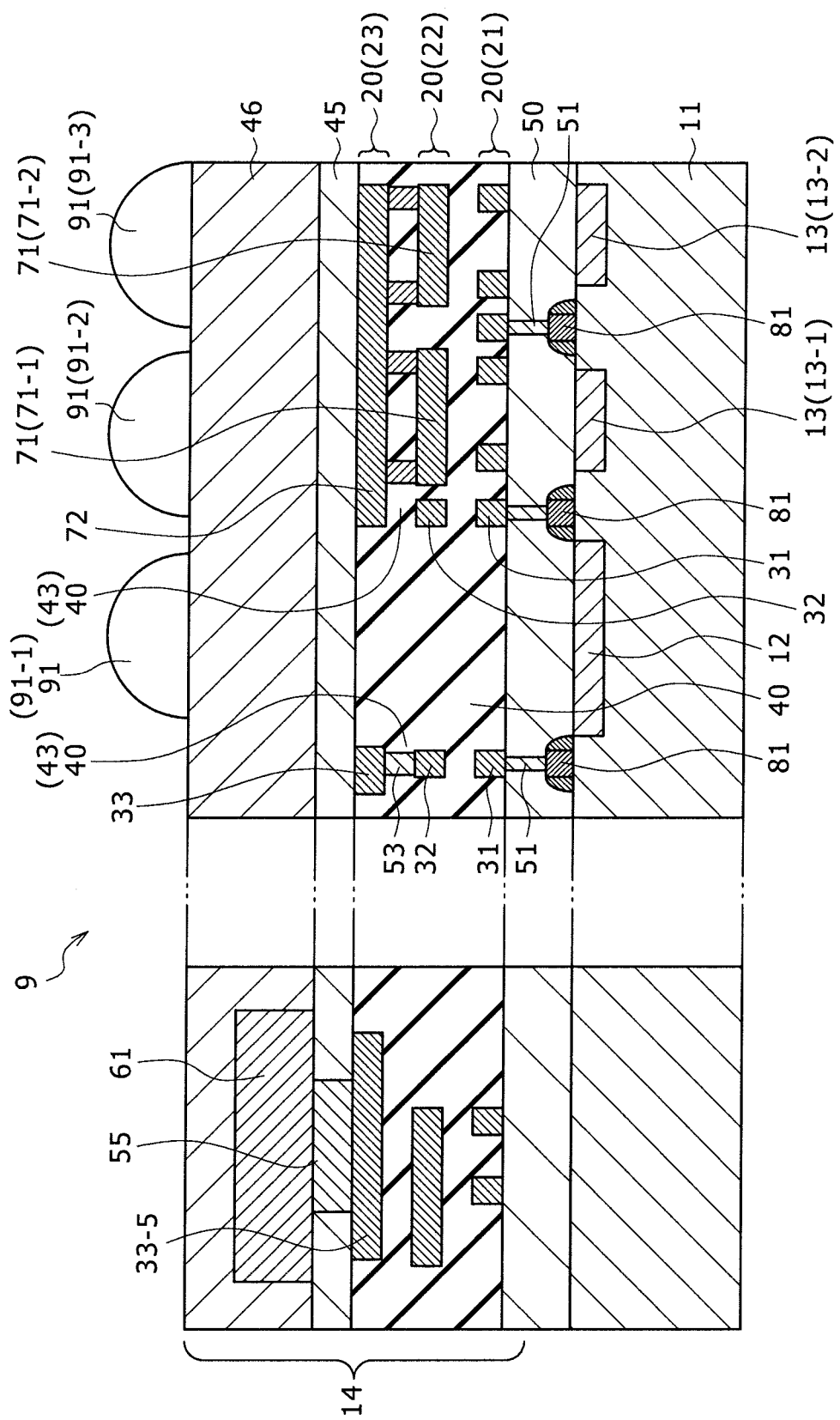
FIG. 10 is a sectional view showing the schematic configuration of a ninth embodiment of the present invention relating to the third solid-state imaging device.

A ninth embodiment of the present invention relating to the above-described third solid-state imaging device will be described below with reference to FIG. 10, which is a sectional view of the schematic structure of the ninth embodiment. FIG. 10 shows a CMOS image sensor as one example of the solid-state imaging device.

As shown in FIG. 10, a third solid-state imaging device 9 includes a light-receiving pixel part 12 and black-level reference pixel parts 13 (13-1 and 13-2) that are formed on a semiconductor substrate 11 and formed of a photodiode. Furthermore, the third solid-state imaging device 9 includes a multilayer interconnect part 14 formed over the light-receiving pixel part 12 and the black-level reference pixel parts 13.

Inside-pixel transistor units 81 are formed on the semiconductor substrate 11. The inside-pixel transistor unit 81 converts signal charges read out from the light-receiving pixel part 12 into voltage, and has e.g. a transfer gate, a reset transistor, an amplification transistor, and a selection transistor. In the drawing, one transistor of each inside-pixel transistor unit 81 is shown and illustration of the other part is omitted. The details of the inside-pixel transistor unit 81 will be described later with reference to FIG. 12.

On the semiconductor substrate 11, a transparent insulating film 50 that covers the light-receiving pixel part 12, the black-level reference pixel parts 13, the inside-pixel transistor units 81, and so on is formed. The surface of this insulating film 50 is planarized for example.

The multilayer interconnect part 14 is formed on the insulating film 50.

The multilayer interconnect part 14 includes plural metal interconnect layers 20 (e.g. a first metal interconnect layer 21, a second metal interconnect layer 22 (equivalent to the first metal interconnect layer), and a third metal interconnect layer 23 (equivalent to the second metal interconnect layer)) formed through sequential stacking from the semiconductor substrate 11 side along the thickness direction of the multilayer interconnect part 14. Furthermore, the multilayer interconnect part 14 includes an interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), a contact plug 53 that penetrates the interlayer insulating film 43 and connects a third metal interconnect 33 of the third metal interconnect layer 23 to a second metal interconnect 32 of the second metal interconnect layer 22 thereunder is formed. Naturally, as metal interconnects connected to each other by a contact plug, there are also metal interconnects formed of other metal interconnect layers, although not shown in the drawing.

Of the metal interconnect layers 20, e.g. a part of a first metal interconnect 31 of the first metal interconnect layer 21 is connected to gate electrodes, diffusion layer regions (not shown), and so on of the inside-pixel transistor units 81 via contact plugs 51 formed in the insulating film 50.

On the top surface of an interlayer insulating film 45 formed to cover the top surface of the uppermost metal interconnect layer 20 (the third metal interconnect layer 23), a pad 61 for electric connection to a peripheral circuit (not shown) or the like is formed by using e.g. aluminum (Al).

In the interlayer insulating film 45 between the pad 61 and a third metal interconnect 33-5 of the third metal interconnect layer 23 directly beneath the pad 61, a contact plug 55 that penetrates the interlayer insulating film 45 and connects the pad 61 to the third metal interconnect 33-5 is formed by using e.g. aluminum (Al).

An interlayer insulating film 46 covering the pad 61 is formed on the interlayer insulating film 45, and an aperture for exposing the surface of the pad 61 is formed above the pad 61 although not shown in the drawing.

At the positions opposed to the photodiodes of the black-level reference pixel parts 13-1 and 13-2, first light-blocking films 71 (71-1 and 71-2) are formed by using second metal interconnects of the second metal interconnect layer 22. The first light-blocking films 71 are each formed with e.g. a plane pattern.

If a gap needs to be provided in the light-blocking area because of the limit to the interconnect arrangement, a gap is disposed between the first light-blocking films 71 in such a manner as to avoid the areas above the black-level reference pixel parts 13, like the gap between the first light-blocking films 71 in FIG. 10.

Above the first light-blocking films 71, a second light-blocking film 72 is formed by using a third metal interconnect of the third metal interconnect layer 23. This second light-blocking film 72 is so formed as to cover the respective first light-blocking films 71 with a one-plane pattern for example.

Furthermore, in the interlayer insulating film 40 (43) between the second metal interconnect layer 22 and the third metal interconnect layer 23, a third light-blocking film 73 that connects an end (e.g. corner) of the first light-blocking film 71 to the second light-blocking film 72 is formed. This third light-blocking film 73 is formed with e.g. line patterns or dot patterns because it is not aimed at electric connection but aimed at increasing the thickness of the light-blocking film and suppressing separation of the light-blocking film.

Mainly by the light-blocking films of two layers, i.e. the first light-blocking films 71 and the second light-blocking film 72, light incidence on the photodiode regions of the black-level reference pixel parts 13 is blocked.

Although not shown in the drawing, a further light-blocking film may be formed above the second light-blocking film 72 by using a metal interconnect layer over the second metal interconnect layer 22. In addition, to further enhance the light-blocking performance, another light-blocking film may be formed below the first light-blocking films 71 by using the first metal interconnect layer 21 or the layer for forming a plug that connects the first metal interconnect layer 21 to the second metal interconnect layer 22.

In this configuration, the light-blocking films are formed by using metal interconnects of metal interconnect layers. Therefore, this configuration has an advantage that the forming of the light-blocking films is not limited by the positions of metal interconnects of the metal interconnect layers over and under the light-blocking films.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens 91 is formed at each of the uppermost parts above the light-receiving pixel part 12 and the black-level reference pixel parts 13 through a transparent insulating film.

The condensing lens 91 (91-1) formed above the light-receiving pixel part 12 condenses incident light and guides the light to the light-receiving pixel part 12. The condensing lenses 91 (91-2 and 91-3) formed above the black-level reference pixel parts 13 (13-1 and 13-2) condense incident light and guide the light to the surface of the second light-blocking film 72. By forming the condensing lenses 91-2 and 91-3 above the black-level reference pixel parts 13, leakage of incident light into the black-level reference pixel parts 13 is prevented.

In the ninth embodiment relating to the third solid-state imaging device, light-blocking films of two layers, i.e. the first light-blocking films 71 and the second light-blocking film 72, are formed and thus a light-blocking structure having thickness larger than that of the light-blocking film of one layer in the related art is formed. This can enhance the light-blocking performance and sufficiently enhances the light blocking above the black-level reference pixel part 13. In addition, because the first light-blocking films 71 and the second light-blocking film 72 are formed of metal interconnects of the second metal interconnect layer 22 and the third metal interconnect layer 23, respectively, an additional metal layer for the light-blocking film does not need to be formed. Therefore, it is possible to decrease the thickness of the interconnect layer while keeping high light-blocking performance, and shorten the light-condensing distance.

Figure 11:
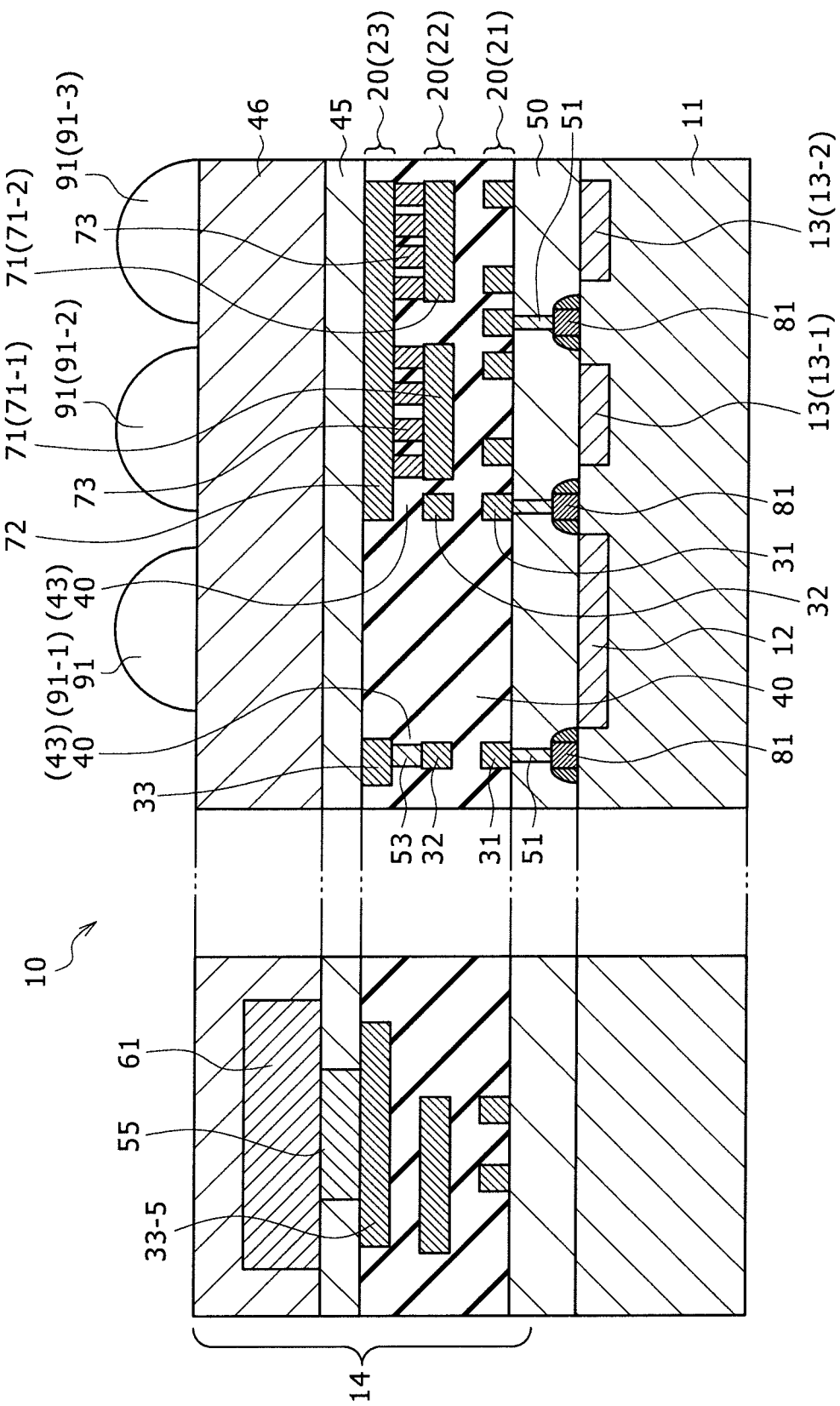
FIG. 11 is a sectional view showing the schematic configuration of a tenth embodiment of the present invention relating to the third solid-state imaging device.

A tenth embodiment of the present invention relating to the above-described third solid-state imaging device will be described below with reference to FIG. 11, which is a sectional view of the schematic structure of the tenth embodiment. FIG. 11 shows a CMOS image sensor as one example of the solid-state imaging device.

As shown in FIG. 11, a third solid-state imaging device 10 includes a light-receiving pixel part 12 and black-level reference pixel parts 13 (13-1 and 13-2) that are formed on a semiconductor substrate 11 and formed of a photodiode. Furthermore, the third solid-state imaging device 10 includes a multilayer interconnect part 14 formed over the light-receiving pixel part 12 and the black-level reference pixel parts 13.

Inside-pixel transistor units 81 are formed on the semiconductor substrate 11. The inside-pixel transistor unit 81 converts signal charges read out from the light-receiving pixel part 12 into voltage, and has e.g. a transfer gate, a reset transistor, an amplification transistor, and a selection transistor. In the drawing, one transistor of each inside-pixel transistor unit 81 is shown and illustration of the other part is omitted. The details of the inside-pixel transistor unit 81 will be described later with reference to FIG. 12.

On the semiconductor substrate 11, a transparent insulating film 50 that covers the light-receiving pixel part 12, the black-level reference pixel parts 13, the inside-pixel transistor units 81, and so on is formed. The surface of this insulating film 50 is planarized for example.

The multilayer interconnect part 14 is formed on the insulating film 50.

The multilayer interconnect part 14 includes plural metal interconnect layers 20 (e.g. a first metal interconnect layer 21, a second metal interconnect layer 22 (equivalent to the first metal interconnect layer), and a third metal interconnect layer 23 (equivalent to the second metal interconnect layer)) formed through sequential stacking from the semiconductor substrate 11 side along the thickness direction of the multilayer interconnect part 14. Furthermore, the multilayer interconnect part 14 includes an interlayer insulating film 40 that insulates the respective metal interconnect layers 20 from each other.

The metal interconnect layers 20 are formed of metal interconnects of e.g. copper (Cu), aluminum (Al), or tungsten (W), which is used as an interconnect material for a semiconductor device. The interlayer insulating film 40 is formed of e.g. a silicon oxide (SiO$_2$) film. Another material is also available for the interlayer insulating film 40 as long as it insulates the metal interconnects from each other. An inorganic insulating film, an organic insulating film, or the like having optical transparency can be used therefor.

In the interlayer insulating film 40 (43) between the metal interconnect layer 20 (e.g. the third metal interconnect layer 23) and the metal interconnect layer 20 thereunder (the second metal interconnect layer 22), a contact plug 53 that penetrates the interlayer insulating film 43 and connects a third metal interconnect 33 of the third metal interconnect layer 23 to a second metal interconnect 32 of the second metal interconnect layer 22 thereunder is formed. Naturally, as metal interconnects connected to each other by a contact plug, there are also metal interconnects formed of other metal interconnect layers, although not shown in the drawing.

Of the metal interconnect layers 20, e.g. a part of a first metal interconnect 31 of the first metal interconnect layer 21 is connected to gate electrodes, diffusion layer regions (not shown), and so on of the inside-pixel transistor units 81 via contact plugs 51 formed in the insulating film 50.

On the top surface of an interlayer insulating film 45 formed to cover the top surface of the uppermost metal interconnect layer 20 (the third metal interconnect layer 23), a pad 61 for electric connection to a peripheral circuit (not shown) or the like is formed by using e.g. aluminum (Al).

In the interlayer insulating film 45 between the pad 61 and a third metal interconnect 33-5 of the third metal interconnect layer 23 directly beneath the pad 61, a contact plug 55 that penetrates the interlayer insulating film 45 and connects the pad 61 to the third metal interconnect 33-5 is formed by using e.g. aluminum (Al).

An interlayer insulating film 46 covering the pad 61 is formed on the interlayer insulating film 45, and an aperture for exposing the surface of the pad 61 is formed above the pad 61 although not shown in the drawing.

At the positions opposed to the photodiodes of the black-level reference pixel parts 13-1 and 13-2, first light-blocking films 71 (71-1 and 71-2) are formed by using second metal interconnects of the second metal interconnect layer 22. The first light-blocking films 71 are each formed with e.g. plane patterns.

If a gap needs to be provided in the light-blocking area because of the limit to the interconnect arrangement, a gap is disposed between the first light-blocking films 71 in such a manner as to avoid the areas above the black-level reference pixel parts 13, like the gap between the first light-blocking films 71 in FIG. 11.

Above the first light-blocking films 71, a second light-blocking film 72 is formed by using a third metal interconnect of the third metal interconnect layer 23. This second light-blocking film 72 is so formed as to cover the respective first light-blocking films 71 with a one-plane pattern for example.

At ends of the respective first light-blocking films 71 along the vertical direction (column direction), third light-blocking films 73 are formed along the horizontal direction (row direction). The third light-blocking films 73 are formed with e.g. line patterns or dot patterns because they are not aimed at electric connection but aimed at increasing the thickness of the light-blocking film and suppressing separation of the light-blocking film. In FIG. 11, the third light-blocking films 73 are disposed with dot patterns having equal intervals. The respective third light-blocking films 73 are connected to the first light-blocking films 71 and the second light-blocking film 72. The third light-blocking films 73 may be formed of the same layer as that of the contact plug 53.

Due to the provision of the third light-blocking films 73 between the first light-blocking films 71 and the second light-blocking film 72, most part of oblique incident light that travels between the first light-blocking films 71 and the second light-blocking film 72 toward the first light-blocking films 71 can be blocked.

Thus, by the light-blocking films of three layers, i.e. the light-blocking films from the first light-blocking films 71 to the third light-blocking film 73, light incidence on the photodiode regions of the black-level reference pixel parts 13 is blocked.

Although not shown in the drawing, a further light-blocking film may be formed above the second light-blocking film 72 by using a metal interconnect layer over the second metal interconnect layer 22. In addition, to further enhance the light-blocking performance, another light-blocking film may be formed below the first light-blocking film 71 by using the first metal interconnect layer 21 or the layer for forming a plug that connects the first metal interconnect layer 21 to the second metal interconnect layer 22.

In this configuration, the light-blocking films are formed by using metal interconnects of metal interconnect layers. Therefore, this configuration has an advantage that the forming of the light-blocking films is not limited by the positions of metal interconnects of the metal interconnect layers over and under the light-blocking films.

The surface of the interlayer insulating film 46 is planarized. Alternatively, a planarization insulating film (not shown) is formed on the interlayer insulating film 46. A color filter layer is formed on the interlayer insulating film 46 or the planarization insulating film although not shown in the drawing. Furthermore, a condensing lens 91 is formed above each of the light-receiving pixel part 12 and the black-level reference pixel parts 13 through a transparent insulating film.

The condensing lens 91 (91-1) formed above the light-receiving pixel part 12 condenses incident light and guides the light to the light-receiving pixel part 12. The condensing lenses 91 (91-2 and 91-3) formed above the black-level reference pixel parts 13 (13-1 and 13-2) condense incident light and guide the light to the surface of the second light-blocking film 72. By forming the condensing lenses 91-2 and 91-3 above the black-level reference pixel parts 13, leakage of incident light into the black-level reference pixel parts 13 is prevented.

In the tenth embodiment relating to the third solid-state imaging device, the light-blocking films from the first light-blocking films 71 to the third light-blocking film 73 are formed and thus a light-blocking structure having thickness larger than that of the light-blocking film of one layer in the related art is formed. This can enhance the light-blocking performance and sufficiently enhances the light blocking above the black-level reference pixel parts 13. In addition, the first light-blocking films 71 and the second light-blocking film 72 are formed of metal interconnects of the second metal interconnect layer 22 and the third metal interconnect layer 23, respectively. The third light-blocking films may be formed of the same layer as that of the contact plug 53. Thus, an additional metal layer for the light-blocking film does not need to be formed. Therefore, it is possible to decrease the thickness of the interconnect layer while keeping high light-blocking performance, and shorten the light-condensing distance.

One example of the layout of the third light-blocking films in the tenth embodiment relating to the third solid-state imaging device will be described below with reference to the plan layout view of FIG. 12.

Figure 12:
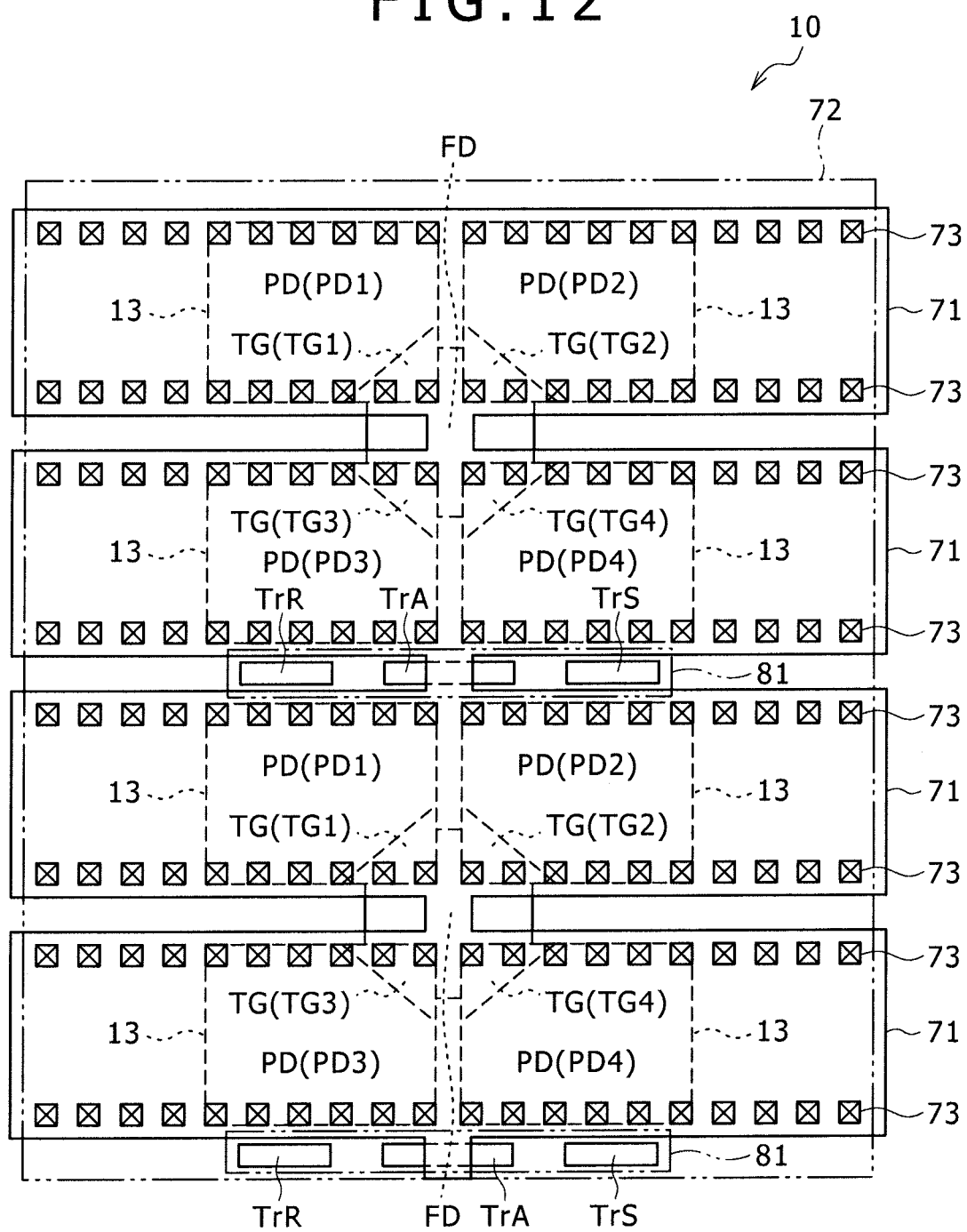
FIG. 12 is a diagram showing the planner layout of the tenth embodiment relating to the third solid-state imaging device.

As shown in FIG. 12, in the solid-state imaging device 10, photodiodes PD for converting incident light into electric signals are arranged in e.g. squares. A floating diffusion part FD is provided at the center part among four photodiodes PD (PD1), PD (PD2), PD (PD3), and PD (PD4) adjacent to each other along the diagonal directions, of the plural photodiodes PD. Transfer gates TG (TG1, TG2, TG3, and TG4) connected to the photodiodes PD (PD1, PD2, PD3, and PD4), respectively, are so formed as to be connected to the floating diffusion part FD.

Furthermore, the inside-pixel transistor unit 81 that converts signal charges read out from the respective photodiodes PD into voltages is disposed and shared by the photodiodes PD1, PD2, PD3, and PD4.

The inside-pixel transistor unit 81 has e.g. a reset transistor TrR, an amplification transistor TrA as a signal amplifier, and a selection transistor TrS.

The transfer gate TG is connected between the cathode electrode of the photodiode PD and the floating diffusion part FD. The transfer gate TG transfers signal charges (electrons, in the present example) that are obtained by photoelectric conversion by the photodiode PD and accumulated therein to the floating diffusion part FD in response to supply of a transfer pulse to the gate electrode (control electrode) of the transfer gate TG.

The drain electrode of the reset transistor TrR is connected to a reset line (not shown), and the source electrode thereof is connected to the floating diffusion part FD. Previous to the transferring of signal charges from the photodiode PD to the floating diffusion part FD, the reset transistor TrR resets the potential of the floating diffusion part FD to a reset voltage Vrst in response to supply of a reset pulse RST to the gate electrode thereof.

The gate electrode of the amplification transistor TrA is connected to the floating diffusion part FD and the drain electrode thereof is connected to a pixel power supply Vdd. The amplification transistor TrA outputs the potential of the floating diffusion part FD obtained after the resetting by the reset transistor TrR as a reset level. Furthermore, the amplification transistor TrA outputs the potential of the floating diffusion part FD obtained after the transferring of signal charges by the transfer gate TG as a signal level.

The drain electrode of the selection transistor TrS is connected to the source electrode of the amplification transistor TrA and the source electrode thereof is connected to an output signal line (not shown) for example. The selection transistor TrS enters the on-state in response to supply of a selection pulse SEL to the gate electrode thereof, to thereby set the pixel to the selected state and output the signal from the amplification transistor TrA to the output signal line (not shown).

It is also possible to employ a configuration in which the selection transistor TrS is connected between the pixel power supply Vdd and the drain electrode of the amplification transistor TrA.

The configuration of the photodiode PD is common to both the light-receiving pixel part (not shown) and the black-level reference pixel parts 13.

As shown in FIG. 12, the first light-blocking films 71 are formed above the black-level reference pixel parts 13. The first light-blocking films 71 are so provided along the horizontal direction as to cover the photodiodes PD on the respective rows arranged along the horizontal direction for example.

Furthermore, the second light-blocking film 72 is formed above the photodiodes PD of the black-level reference pixel parts 13. This second light-blocking film 72 is so formed as to cover the whole of the black-level reference pixel parts 13.

At vertical ends of the respective first light-blocking films 71, the third light-blocking films 73 are formed along the horizontal direction (row direction). The third light-blocking films 73 are formed with e.g. dot patterns having equal intervals. The respective third light-blocking films 73 are connected to the first light-blocking films 71 and the second light-blocking film 72.

In some cases, the first light-blocking films 71 are provided along the vertical direction and the third light-blocking films 73 are arranged along the vertical direction. Furthermore, it is also possible that the third light-blocking films 73 are formed with e.g. dot patterns or line patterns in the entire area between the first light-blocking films 71 and the second light-blocking film 72.

Examples of the materials of the metal interconnects and the contact plugs for connection of the metal interconnects in the above-described respective embodiments include, besides copper and aluminum, other metal materials used for metal interconnects, such as tungsten, aluminum alloys, and copper alloys.

Examples of the material used as a barrier metal for the metal interconnects include titanium, tantalum, tungsten, ruthenium, nitrides of these metals, alloys composed mainly of any of these metals, and multilayer films composed of materials selected from these metals, the nitrides of these metals, and the alloys of these metals.

The second light-blocking film 72 and the fourth light-blocking film 74 in the sixth embodiment relating to the second solid-state imaging device, and the first light-blocking film 71 and the second light-blocking film 72 in the ninth and tenth embodiments relating to the third solid-state imaging device may serve also for electric connection.

In this case, these light-blocking films can be used as not only normal interconnects but also shunt lines. For example, if the light-blocking films are used as lines for allowing the flow of current with high current density, such as power supply interconnects, the light-blocking films are effective as countermeasures against increase in the interconnect resistance due to reduction in the thickness of the interconnects. In particular, the light-blocking films are effective to reduce the power consumption in a large-area solid-state imaging device having large interconnect length.

A description will be made below about the necessary thickness of the light-blocking film that serves also as a metal interconnect in the multilayer interconnect part 14 in the above-described respective embodiments.

In general, the black-level reference pixel part 13 is required to sufficiently attenuate incident light irrespective of the illuminance in order for the solid-state imaging device to achieve the desired contrast even under a high-illuminance environment.

The illuminance by the sunlight under a natural environment possibly reaches 100000 lx (lux) or higher although depending on the place. In the following, discussion will be made about the necessary thickness of the light-blocking film to decrease this high illuminance to 0.1 lx or lower.

The light-blocking performance is represented by reflection by the surface of a substance and absorption in the substance. For example, the transmittance T of incident light on a material film, the reflectivity R of the incident light, the absorption coefficient α of the incident light, and the thickness d of the material film have the relationship represented by Equation (1).

$$T = (1-R)\exp(-\alpha d) \quad (1)$$

If the transmittance of a material film having a thickness of $d_1$ is defined as $T_1$ and the transmittance of a material film having a thickness of $d_2$ is defined as $T_2$, the relationship between $T_1$ and $T_2$ can be represented as Equation (2) based on Equation (1).

$$\log(T_1/T_2)=-\alpha(d_1-d_2) \quad (2)$$

The absorption coefficient $\alpha$ can be represented as Equation (3) with use of an extinction coefficient K.

$$\alpha=(4\pi/\lambda)K \quad (3)$$

Therefore, the relationship among the transmittance T, the thickness d of the material film, and the extinction coefficient K is represented as Equation (4).

$$\log(T_1/T_2)=-(4\pi/\lambda)K(d_1-d_2) \quad (4)$$

That is, Equation (4) shows that, when the logarithm of the transmittance T of a light-blocking film is plotted on the ordinate and the thickness d of the light-blocking film is plotted on the abscissa, a straight line is obtained and a larger slope of this line indicates a higher extinction coefficient K, i.e. higher light-blocking capability.

Representing the light-blocking characteristics by graphs obtained by plotting the logarithm of the transmittance T in this manner makes it easier to compare the light-blocking characteristics of the respective material films with each other. Thus, all the transmittances are represented in dB in the present description. The equation for the conversion into dB is as follows.

$$dB=20 \log T \quad (5)$$

Figure 13:
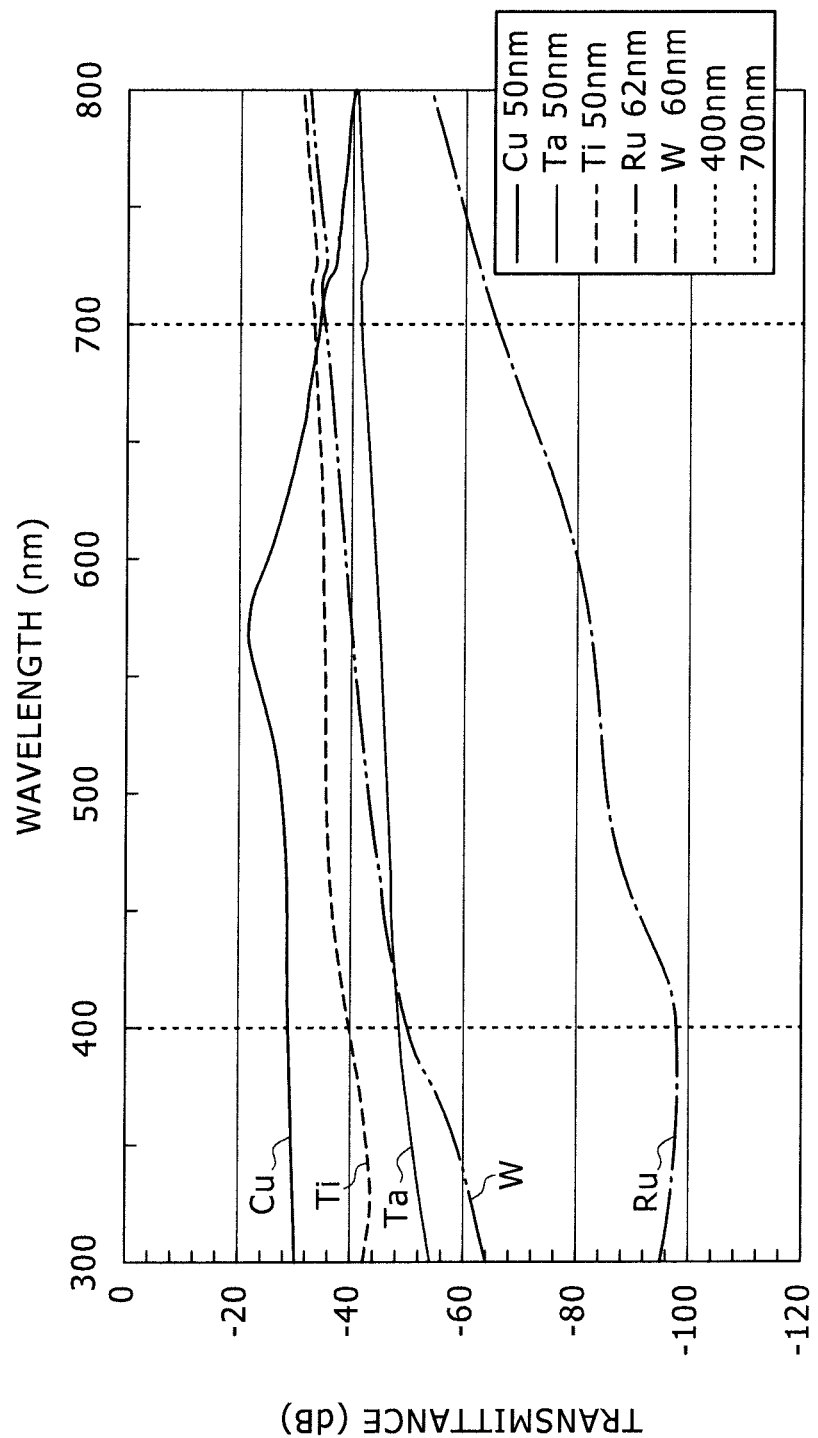
FIG. 13 is a diagram showing measured data on the dependency of the transmittance on the wavelength in the visible light range.

Regarding copper, tantalum, titanium, ruthenium, and tungsten, the relationship between the transmittance and the wavelength of incident light is shown in FIG. 13 as measured data on the dependency of the transmittance on the wavelength in the visible light range.

Figure 14:
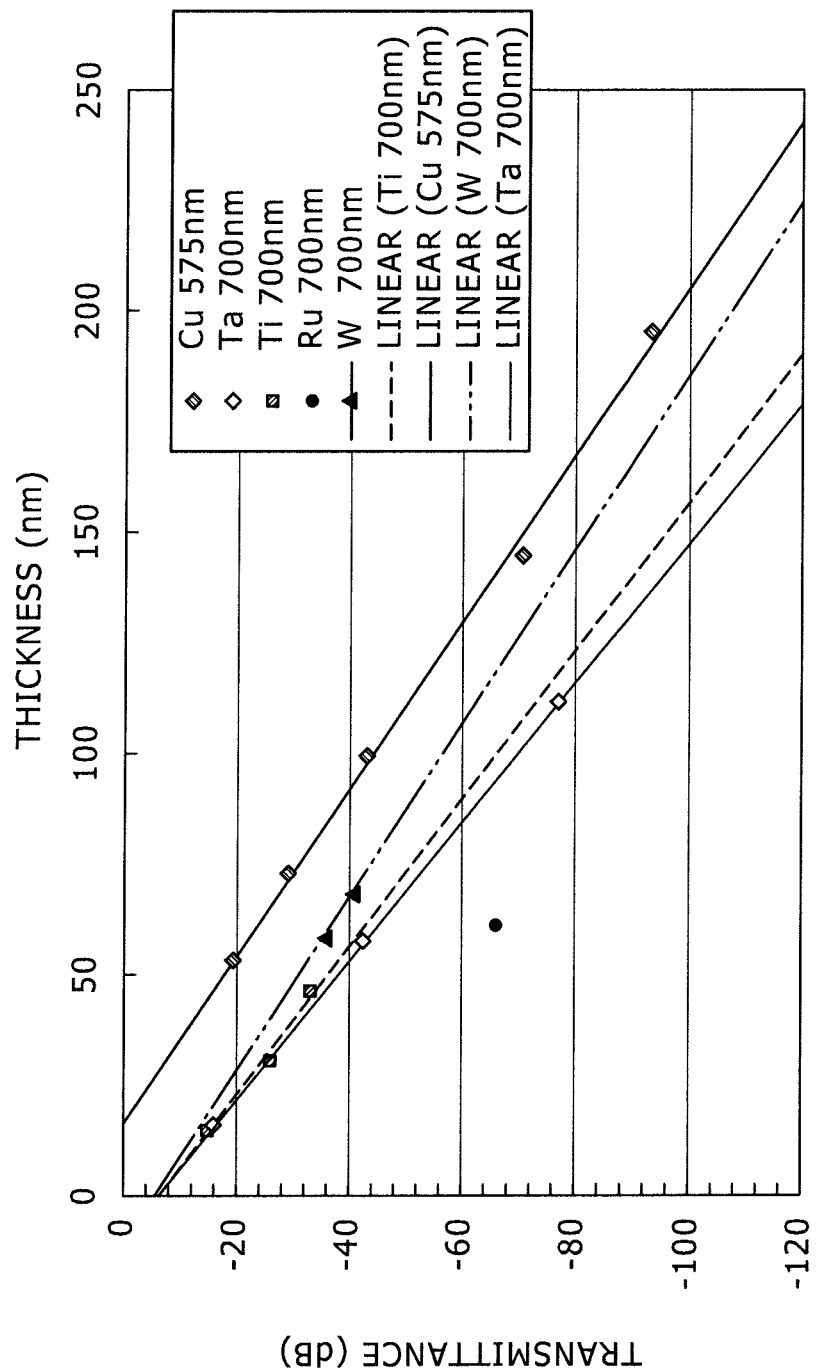
FIG. 14 is a diagram showing measured data on the dependency of the transmittance on the film thickness with respect to a wavelength that provides high transmittance.

Furthermore, regarding the same metals, the relationship between the film thickness and the transmittance with respect to incident light with a wavelength that provides high transmittance is shown in FIG. 14 as measured data on the dependency of the transmittance on the film thickness with respect to the wavelength that provides high transmittance.

Light-blocking performance equivalent to a transmittance of −120 dB or lower is needed to attenuate the light intensity from 100000 lx (lux) to 0.1 lx (lux). For example, if tantalum is used for a barrier metal for a copper interconnect and the thickness of the tantalum film is 15 nm, the copper interconnect needs to have a thickness of 216 nm in order to achieve light-blocking performance equivalent to −120 dB. If the thickness of the copper interconnect per one layer is smaller than 216 nm, it is effective to apply any of the above-described embodiments.

An embodiment of the present invention relating to the first manufacturing method for a solid-state imaging device will be described below with reference to FIG. 1.

As shown in FIG. 1, through a normal manufacturing method for a solid-state imaging device, the light-receiving pixel part 12 and the black-level reference pixel part 13 each formed of a photodiode are formed on the semiconductor substrate 11, and the multilayer interconnect part 14 is formed on the top surfaces of the light-receiving pixel part 12 and the black-level reference pixel part 13.

The multilayer interconnect part 14 is formed by alternately forming the interlayer insulating film 40 and the metal interconnect layers 20 (e.g. the first metal interconnect layer 21, the second metal interconnect layer 22 (equivalent to the first metal interconnect layer), and the third metal interconnect layer 23 (equivalent to the second metal interconnect layer)) sequentially from the semiconductor substrate 11 side. Furthermore, contact plugs that penetrate the interlayer insulating film 40 between the metal interconnect layers 20 are formed according to need. For example, in the interlayer insulating film 40 (43) between the metal interconnect layer 20 (the third metal interconnect layer 23) and the metal interconnect layer 20 thereunder (the second metal interconnect layer 22), the contact plug 53 that penetrates the interlayer insulating film 43 and connects the third metal interconnect 33 of the third metal interconnect layer 23 to the second metal interconnect 32 (equivalent to the first metal interconnect) of the second metal interconnect layer 22 thereunder is formed. Naturally, a contact plug is formed also between metal interconnects formed of other metal interconnect layers although not shown in the drawing.

The metal interconnect layers 20 are formed by using metal interconnects of e.g. copper (Cu), aluminum (Al), or tungsten (W), which is used as an interconnect material for a semiconductor device. The interlayer insulating film 40 is formed by using e.g. a silicon oxide ($SiO_2$) film. Another material is also available for the interlayer insulating film 40 as long as it insulates the metal interconnects from each other. An inorganic insulating film, an organic insulating film, or the like having optical transparency can be used therefor.

At the time of the forming of the contact plug 53, the first light-blocking film 71 is formed separately from the second metal interconnect 32 formed of the second metal interconnect layer 22 above the areas between the second metal interconnects 32 of the second metal interconnect layer 22 above the black-level reference pixel part 13. That is, the first light-blocking film 71 is formed in the same step as the step of forming the contact plug 53. This first light-blocking film 71 is formed with e.g. line patterns.

Furthermore, in the same step as the step of forming the third metal interconnect 33 of the third metal interconnect layer 23, i.e. by using the same material layer as that of the third metal interconnect 33 of the third metal interconnect layer 23, the second light-blocking film 72 is so formed as to be connected to the first light-blocking film 71. This second light-blocking film 72 is formed with e.g. a plane pattern.

Thereafter, the interlayer insulating film 45 is so formed as to cover the top surface of the uppermost metal interconnect layer 20 (the third metal interconnect layer 23), and a connection hole that reaches the third metal interconnect 33-5 of the third metal interconnect layer 23 is formed in the interlayer insulating film 45. Inside the connection hole, the contact plug 55 for connection to the third metal interconnect 33-5 is formed by using e.g. aluminum (Al). On the top surface of the interlayer insulating film 45, the pad 61 that is connected to the contact plug 55 and allows electric connection to a peripheral circuit (not shown) or the like is formed by using e.g. aluminum (Al). It is also possible to form the pad 61 and the contact plug 55 by using the same layer.

The interlayer insulating film 46 covering the pad 61 is formed.

The surface of the interlayer insulating film 46 is planarized. Alternatively, a planarization insulating film (not shown) is formed on the interlayer insulating film 46.

A color filter layer is formed on the interlayer insulating film 46 or the planarization insulating film although not shown in the drawing. Furthermore, a condensing lens is formed above each of the light-receiving pixel part 12 and the black-level reference pixel part 13 through a transparent insulating film.

The condensing lens formed above the light-receiving pixel part 12 condenses incident light and guides the light to the light-receiving pixel part 12. The condensing lens formed above the black-level reference pixel part 13 condenses incident light and guides the light to the surface of the second light-blocking film 72. By forming the condensing lens also above the black-level reference pixel part 13, leakage of incident light into the black-level reference pixel part 13 is prevented.

In the above description, the second light-blocking film 72 is formed by using the uppermost third metal interconnect layer 23 and the first light-blocking film 71 is formed between the third metal interconnect layer 23 and the second metal interconnect layer 22 next thereto in the lower-layer direction. However, the first light-blocking film 71 may be formed between the first metal interconnect layer 21 and the second metal interconnect layer 22. In addition, if the number of metal interconnect layers is four or more, the first light-blocking film 71 may be formed between metal interconnect layers as intermediate layers. Therefore, the second light-blocking film 72 is formed by using the metal interconnect layer immediately above that of the first light-blocking film 71.

The first light-blocking film 71 may be formed with either line patterns or dot patterns. The line patterns may have either a uniform width or various widths.

Similarly, the dot patterns may have either a uniform size or various sizes.

Moreover, configurations like those according to the second to fifth embodiments relating to the above-described first solid-state imaging device can be formed. In this case, if a light-blocking film is formed between metal interconnect layers, the light-blocking film is formed in the same step and by using the same material layer as those of a contact plug to be formed between the metal interconnect layers. If a light-blocking film is formed by using a metal interconnect layer, the light-blocking film is formed in the same step and by using the same material layer as those of a metal interconnect of the metal interconnect layer.

In the case of forming the third light-blocking film 73 that is at least opposed to the areas in which the first light-blocking film 71 is not formed through the second light-blocking film 72, the forming of the third light-blocking film 73 is adjusted based on the pattern of the photomask used to form the first light-blocking film 71 and the pattern of the photomask used to form the third light-blocking film 73.

The third light-blocking film 73 may be formed with either line patterns or dot patterns. The line patterns may have either a uniform width or various widths.

Similarly, the dot patterns may have either a uniform size or various sizes.

In the above-described first manufacturing method, the first light-blocking film 71 is formed between the second metal interconnect layer 22 and the third metal interconnect layer 23, and the second light-blocking film 72 is formed by using the third metal interconnect layer 23. Therefore, the light-blocking films are formed in two layers, which can enhance the capability of the light blocking above the black-level reference pixel part 13. In addition, because the light-blocking films are formed by using a layer between the metal interconnect layers and the metal interconnect layer, an additional metal layer for the light-blocking film does not need to be formed. Therefore, it is possible to decrease the thickness of the interconnect layer while keeping high light-blocking performance, and shorten the light-condensing distance.

An embodiment of the present invention relating to the second manufacturing method for a solid-state imaging device will be described below with reference to FIG. 6.

In this embodiment, the steps other than the steps of forming the light-blocking films are similar to those in a normal manufacturing method for a solid-state imaging device. Therefore, the steps of forming the light-blocking films will be described in the following.

The first light-blocking film 71 is formed above the areas between the first metal interconnects 31 of the first metal interconnect layer 21 above the black-level reference pixel part 13. Specifically, in the step of forming a contact plug (not shown) that connects the first metal interconnect 31 of the first metal interconnect layer 21 to the second metal interconnect 32 of the second metal interconnect layer 22, the first light-blocking film 71 is formed separately from the first metal interconnect 31 above the areas between the first metal interconnects 31 of the first metal interconnect layer 21 above the black-level reference pixel part 13. That is, the first light-blocking film 71 is formed in the same step as the step of forming the contact plug. This first light-blocking film 71 is formed with e.g. line patterns.

The second light-blocking film 72 is so formed as to be connected to the first light-blocking film 71 in the same step as the step of forming the second metal interconnect 32 of the second metal interconnect layer 22, i.e. by using the same material layer as that of the second metal interconnect 32 of the second metal interconnect layer 22. This second light-blocking film 72 is formed with e.g. a plane pattern.

The third light-blocking film 73 is so formed as to be connected to the second light-blocking film 72 in the same step as the step of forming the contact plug 53 that connects the second metal interconnect 32 of the second metal interconnect layer 22 to the third metal interconnect 33 of the third metal interconnect layer 23, i.e. by using the same material layer as that of the contact plug 53. This third light-blocking film 73 is formed with e.g. line patterns. It is desirable that the intervals between the line patterns be set to as small value as possible. For example, patterning with the intervals corresponding to the exposure limit can be employed.

The fourth light-blocking film 74 is so formed as to be connected to the third light-blocking film 73 in the same step as the step of forming the third metal interconnect 33 of the third metal interconnect layer 23, i.e. by using the same material layer as that of the third metal interconnect 33 of the third metal interconnect layer 23. This fourth light-blocking film 74 is formed with e.g. a plane pattern.

In the second manufacturing method, the light-blocking films are formed in four layers. Thus, the capability of the light blocking above the black-level reference pixel can be enhanced. In addition, because the light-blocking films are formed by using layers between the metal interconnect layers and the metal interconnect layers, an additional metal layer for the light-blocking film does not need to be formed. Therefore, it is possible to decrease the thickness of the interconnect layer while keeping high light-blocking performance, and shorten the light-condensing distance.

In the present embodiment, the second light-blocking film 72 and the fourth light-blocking film 74 formed of plane metal films are formed through the interlayer insulating film 40 (43). In general, because the insulating film and the metal film, which are different in the stress, are stacked, separation at the interface between the insulating film and the metal film possibly occurs due to the stress difference between the insulating film and the metal film.

However, in the above-described configuration, the third light-blocking film 73 formed with line patterns or dot patterns is provided between the second light-blocking film 72 and the fourth light-blocking film 74, and thus the stress is dispersed due to the third light-blocking film 73. As a result, the adhesion between the second light-blocking film 72 and the interlayer insulating film 40 (43) and the adhesion between the fourth light-blocking film 74 and the interlayer insulating film 40 (43) are enhanced by the third light-blocking film 73.

Therefore, the second light-blocking film 72 and the fourth light-blocking film 74 are hardly separated from the interlayer insulating film 40 (43).

An embodiment of the present invention relating to the third manufacturing method for a solid-state imaging device will be described below with reference to FIG. 9.

In this embodiment, the steps other than the steps of forming the light-blocking films are similar to those in a normal manufacturing method for a solid-state imaging device. Therefore, the steps of forming the light-blocking films will be described in the following.

The first light-blocking film 71 is formed by using the second metal interconnect 32 of the second metal interconnect layer 22 (equivalent to the first metal interconnect layer) above the black-level reference pixel part 13 in the same step as the step of forming the second metal interconnect 32 of the second metal interconnect layer 22. That is, the first light-blocking film 71 is formed by using the same material layer as that of the second metal interconnect 32 of the second metal interconnect layer 22. This first light-blocking film 71 is formed with e.g. a plane pattern.

The second light-blocking film 72 is formed in the same step as the step of forming the third metal interconnect 33 of the third metal interconnect layer 23 (equivalent to the second metal interconnect layer), i.e. by using the same material layer as that of the third metal interconnect 33 of the third metal interconnect layer 23. This second light-blocking film 72 is formed with e.g. a plane pattern.

Although not shown in the drawing, a further light-blocking film may be formed above the second light-blocking film 72 by using a metal interconnect layer over the second metal interconnect layer.

In the third manufacturing method, the light-blocking films are formed in two layers or more layers. Thus, the capability of the light blocking above the black-level reference pixel can be enhanced. In addition, because the light-blocking films are formed by using the metal interconnect layers, an additional metal layer for the light-blocking film does not need to be formed. Therefore, it is possible to decrease the thickness of the interconnect layer while keeping high light-blocking performance, and shorten the light-condensing distance.

Next, a description will be made below about a specific method for forming light-blocking films by using a layer between metal interconnect layers and the metal interconnect layer over this layer.

Figure 15A:
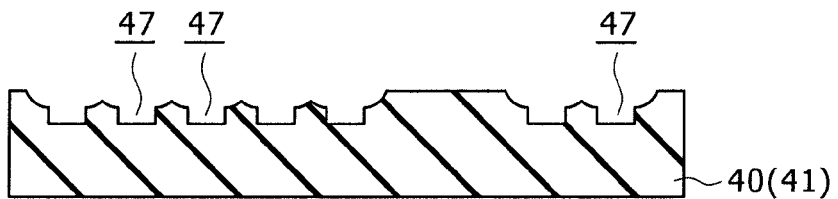
FIGS. 15A to 15D are manufacturing-step sectional views showing a specific example of a method for manufacturing light-blocking films.

As shown in FIG. 15A, plural trenches 47 (or holes) for forming the first light-blocking film are formed in the interlayer insulating film 40 (41). In the present description, trenches are employed. The trenches 47 are formed simultaneously with connection holes for forming contact plugs as described above.

If the intervals of the plural trenches 47 are set to a small value such as the value corresponding to the exposure limit, the first light-blocking film is formed with high density. This allows upper part of the interlayer insulating film 41 between the trenches 47 to be also etched.

Figure 15B:
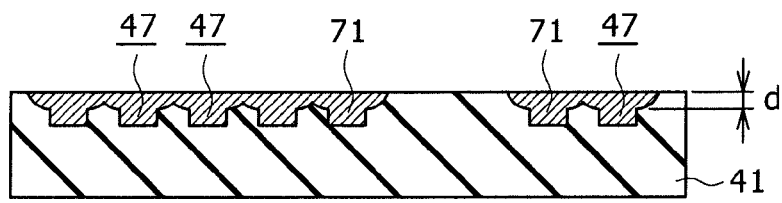

Subsequently, as shown in FIG. 15B, a metal interconnect material is buried in the trenches 47 and the excess metal interconnect material over the interlayer insulating film 41 is removed to thereby form the first light-blocking film 71 inside the trenches 47. Because the upper part of the interlayer insulating film 41 between the trenches 47 is also etched, side part of the first light-blocking film 71 formed through the burying in the trenches 47 is allowed to have thickness increased by d.

Figure 15C:
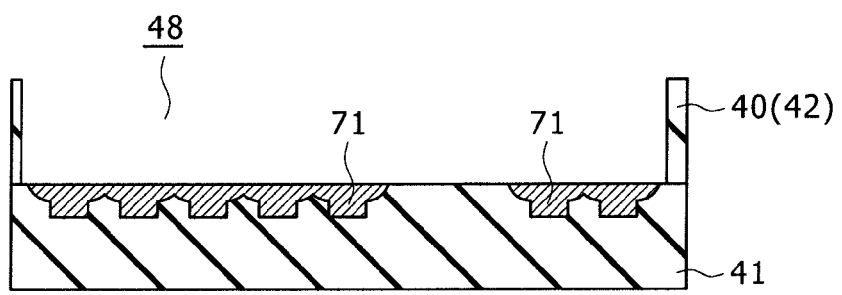

Subsequently, as shown in FIG. 15C, the interlayer insulating film 40 (42) is formed on the interlayer insulating film 41, and a trench 48 for forming the second light-blocking film is formed above the plural first light-blocking films 71 simultaneously with forming of a trench for forming a metal interconnect of a metal interconnect layer.

Figure 15D:
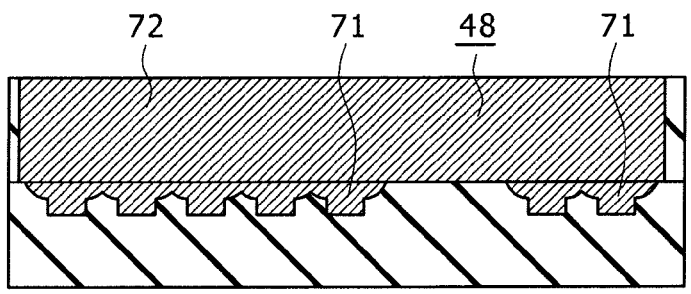

Subsequently, as shown in FIG. 15D, a metal interconnect material is buried in the trench 48 and the excess metal interconnect material over the interlayer insulating film 42 is removed to thereby form the second light-blocking film 72 inside the trench 48. Thus, the second light-blocking film 72 is formed on the first light-blocking film 71 and the thickness of the second light-blocking film 72 is increased by the first light-blocking film 71.

The above-described process can be applied to the methods for forming the light-blocking films from the first light-blocking film 71 to the fourth light-blocking film 74 described for the solid-state imaging devices of the respective embodiments.

Figure 16:
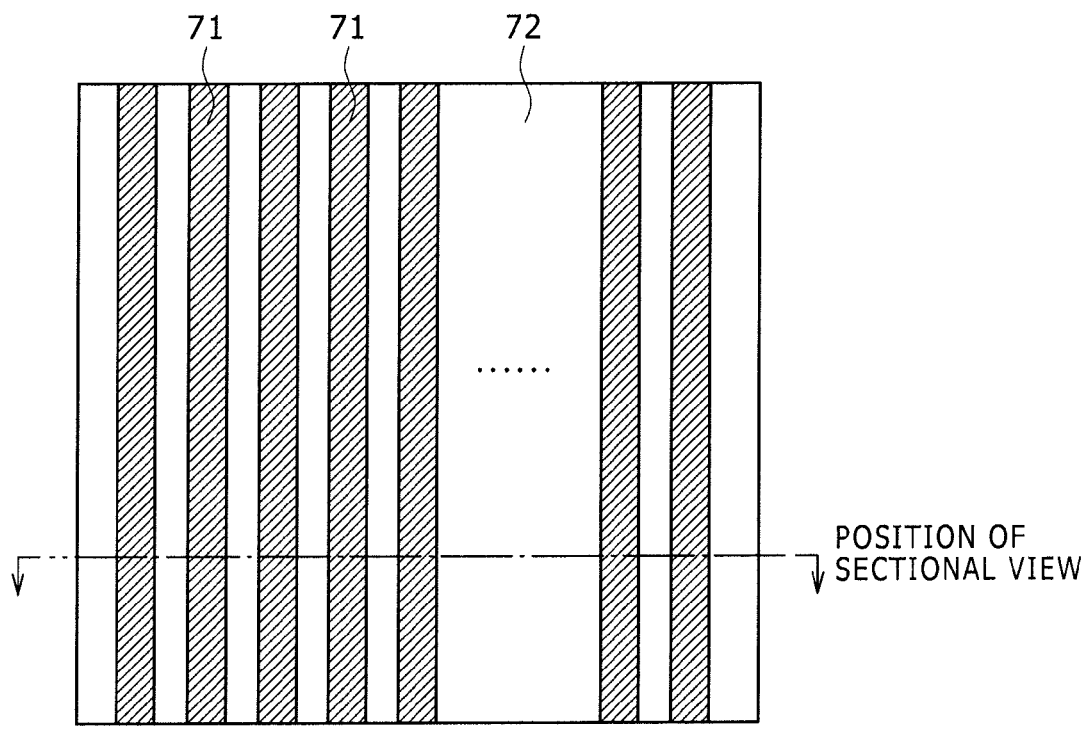
FIG. 16 shows a plan view and sectional view showing one example of the shapes of light-blocking films in the embodiment of the present invention.
Figure 16:
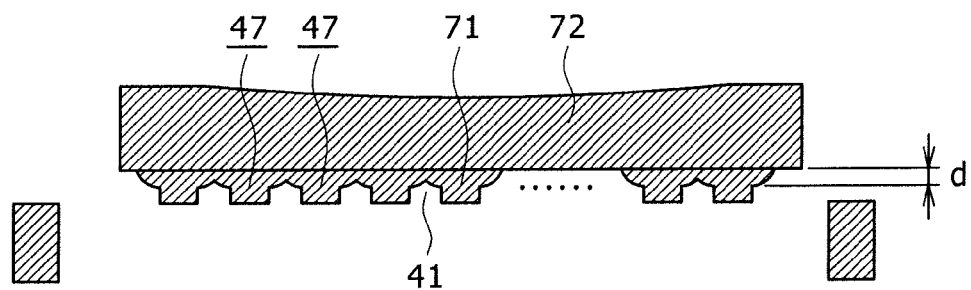

As shown in FIG. 16, forming the first light-blocking film 71 with line patterns having high density provides the effect that upper part of the interlayer insulating film 41 between the trenches 47 is also etched. Therefore, the light-blocking film material is formed also between the first light-blocking films 71 and thus the first light-blocking films 71 having large thickness are formed.

Figure 17:
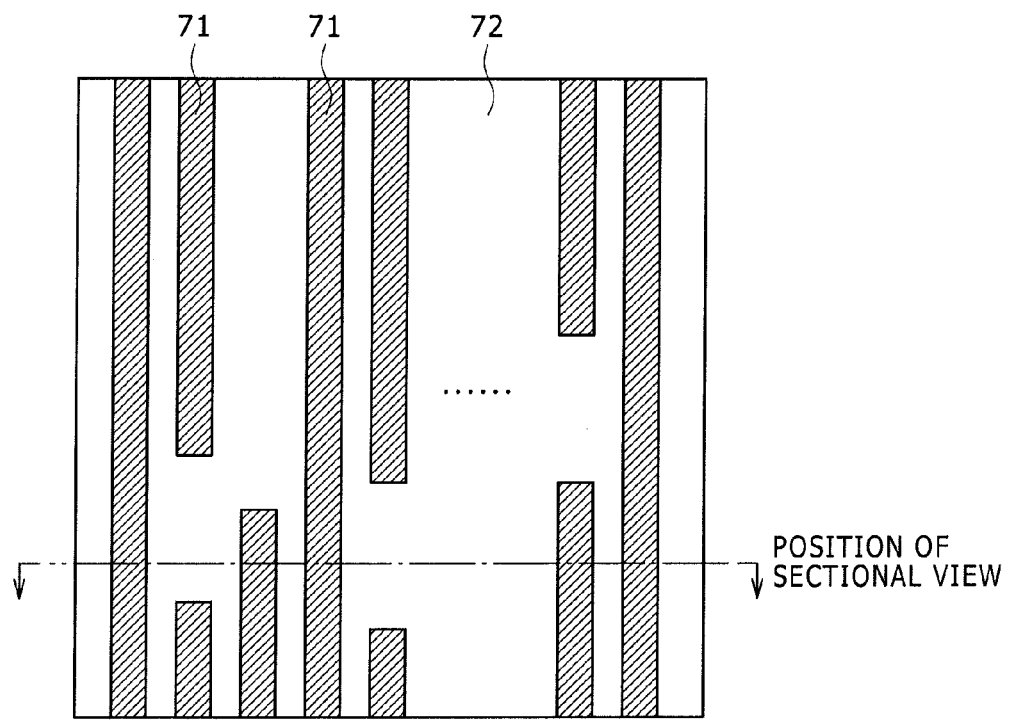
FIG. 17 shows a plan view and sectional view showing one example of the shapes of light-blocking films in the embodiment of the present invention.
Figure 17:
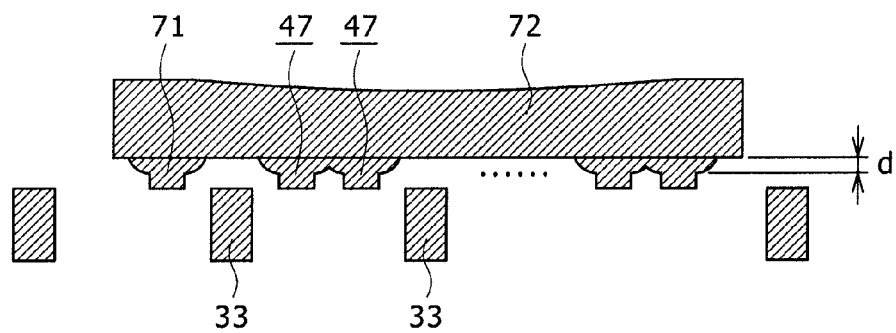

Furthermore, the first light-blocking film 71 should be formed in the areas under which a metal interconnect 33 is not formed. Therefore, as shown in FIG. 17, the first light-blocking film 71 is so formed that the areas corresponding to the metal interconnect 33 are left. Also in this case, the first light-blocking film 71 having partially-large thickness can be formed because side part of the trench 47, in which the first light-blocking film 71 is formed, is etched.

Figure 18:
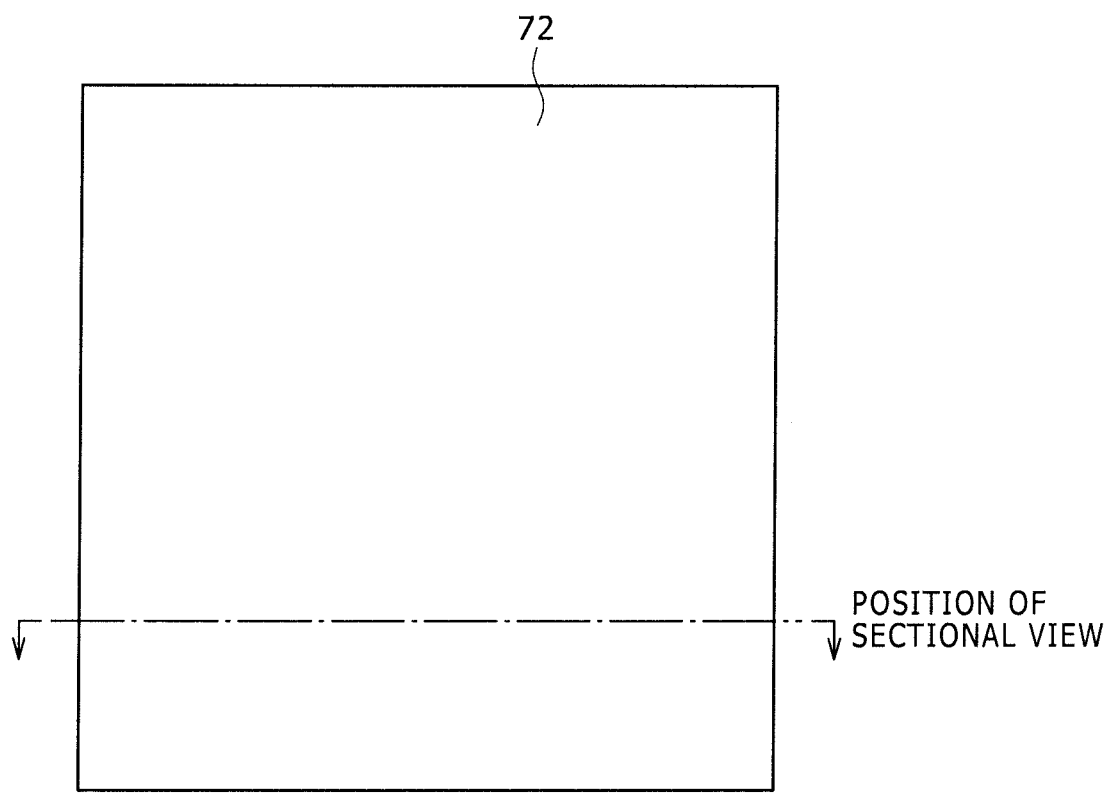
FIG. 18 shows a plan view and sectional view showing one example of the shape of a light-blocking film in the embodiment of the present invention.
Figure 18:
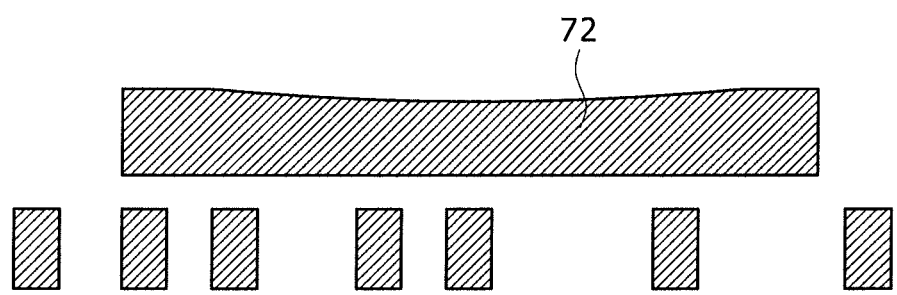
Figure 19:
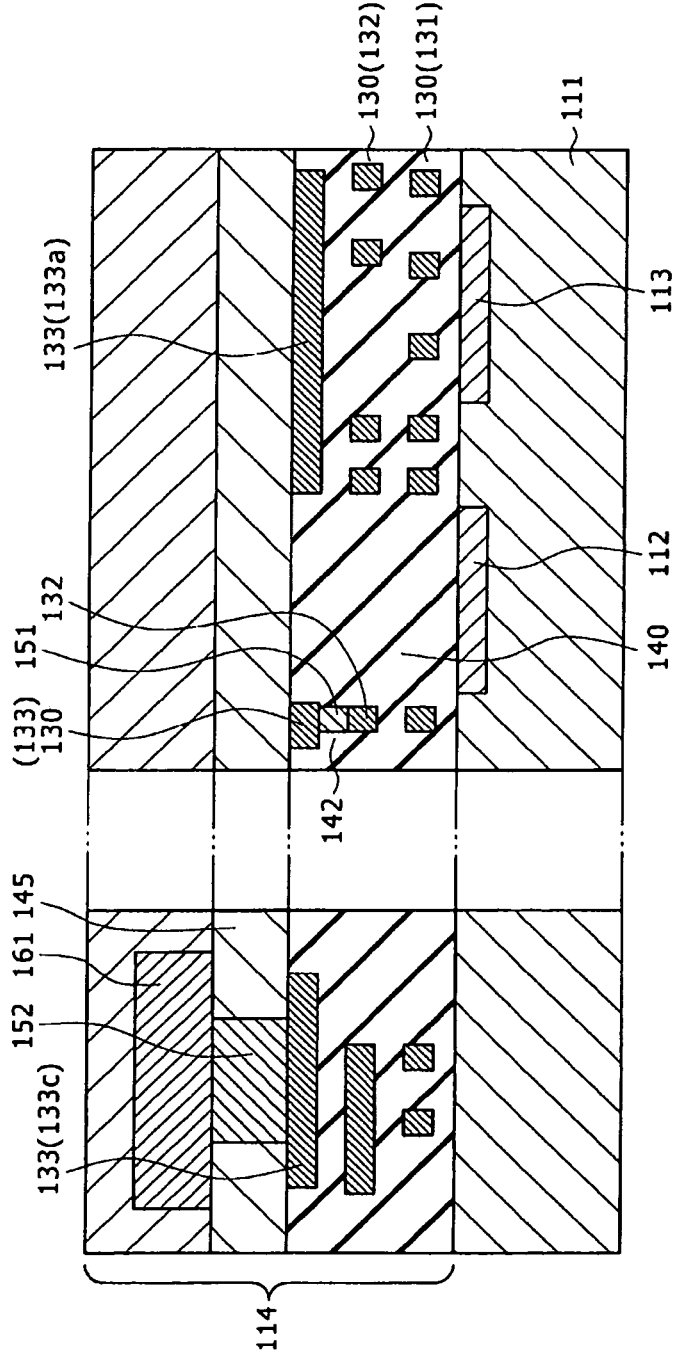
FIG. 19 is a sectional view showing the schematic configuration of one example of a related-art solid-state imaging device.

On the other hand, as shown in FIG. 18, if the first light-blocking film is not formed and thus only the second light-blocking film 72 having a plane pattern is provided, the center part of the second light-blocking film 72 is polished and thinned due to dishing or the like at the time of chemical mechanical polishing, and therefore the light-blocking performance is lowered.

In the above-described respective embodiments, if metal interconnects, contact plugs, light-blocking films, and so on are formed by using copper or a copper alloy, it is preferable to form a barrier metal layer at the interface between the interlayer insulating film and the metal interconnects, the contact plugs, and the light-blocking films in order to prevent diffusion and oxidation of copper. As the barrier metal layer, e.g. a tantalum film, a tantalum nitride film, or a titanium nitride film is used. Furthermore, a tantalum film or a titanium film may be formed as an adhesion layer between the barrier metal layer and the insulating film in order to enhance the adhesion with the insulating film.

If the light-blocking films are formed in plural layers, it is also possible that the uppermost light-blocking film be formed of a metal film having high light-blocking capability. For example, it is more preferable that the uppermost light-blocking film be formed of an aluminum film.

It should also be understood by those skilled in the art that a variety of modifications, combinations, sub-combinations and alterations may occur, depending on design requirements and other factors as far as they are within the scope of the appended claims or the equivalents thereof.

What is claimed is:

1. A solid-state imaging device comprising:
   a layer of first metal interconnects electrically isolated from a semiconductor substrate, said layer of the first metal interconnects being between a layer of second metal interconnects and a black-level reference pixel part of the semiconductor substrate;
   a layer of metallic first light-blocking films between a metallic second light-blocking film and said layer of the second metal interconnects, said layer of the second metal interconnects being electrically isolated from said layer of the first metal interconnects,
   wherein said metallic second light-blocking film is in physical contact with said layer of the metallic first light-blocking films, said layer of the metallic first light-blocking films being electrically isolated from said layer of the second metal interconnects.

2. The solid-state imaging device according to claim 1, wherein said layer of the first metal interconnects is electrically isolated from each of the metallic first light-blocking films.

3. The solid-state imaging device according to claim 1, wherein one of the first metal interconnects is electrically isolated from another of the first metal interconnects.

4. The solid-state imaging device according to claim 1, wherein one of the second metal interconnects is electrically isolated from another of the second metal interconnects.

5. The solid-state imaging device according to claim 1, wherein said layer of the first metal interconnects is a layer of copper, aluminum, or tungsten.

6. The solid-state imaging device according to claim 1, wherein said layer of the second metal interconnects is a layer of copper, aluminum, or tungsten.

7. The solid-state imaging device according to claim 1, wherein said layer of the metallic first light-blocking films is a layer of copper, aluminum, or tungsten.

8. The solid-state imaging device according to claim 1, wherein said metallic second light-blocking film is a layer of copper, aluminum, or tungsten.

9. The solid-state imaging device according to claim 1, wherein said layer of the metallic first light-blocking films and said metallic second light-blocking films are configured to prevent incident light from reaching said black-level reference pixel part.

10. The solid-state imaging device according to claim 9, wherein said black-level reference pixel part is configured to convert said incident light into a signal charge.

11. The solid-state imaging device according to claim 9, wherein a portion of the semiconductor substrate is between a light-receiving pixel part of the semiconductor substrate and said black-level reference pixel part.

12. The solid-state imaging device according to claim 11, wherein said light-receiving pixel part is configured to convert said incident light into a signal charge.

13. The solid-state imaging device according to claim 11, wherein said light-receiving pixel part is configured to receive said incident light.

14. The solid-state imaging device according to claim 11, further comprising:
   a condensing lens configured to guide said incident light to said light-receiving pixel part.

15. The solid-state imaging device according to claim 11, further comprising:
   a condensing lens configured to guide said incident light to said metallic second light-blocking film.

16. The solid-state imaging device according to claim 1, further comprising:
   an interlayer insulating film between an insulation film and said semiconductor substrate.

17. The solid-state imaging device according to claim 16, wherein said metallic second light-blocking film is within said interlayer insulating film.

18. The solid-state imaging device according to claim 16, wherein said layer of the first metal interconnects, said layer of the second metal interconnects, and said layer of the metallic first light-blocking films are within said interlayer insulating film.

19. The solid-state imaging device according to claim 16, wherein said interlayer insulating film electrically isolates said layer of the second metal interconnects from said each of the first metal interconnects and said each of the metallic first light-blocking films.

20. The solid-state imaging device according to claim 1, wherein said layer of the metallic first light-blocking films is in a line pattern, said line pattern being lines of various widths.

* * * * *